United States Patent
Ostrovsky et al.

(10) Patent No.: US 10,401,413 B2
(45) Date of Patent: Sep. 3, 2019

(54) GROUND FAULT DETECTOR

(71) Applicant: Leviton Manufacturing Company, Inc., Melville, NY (US)

(72) Inventors: Michael Ostrovsky, Brooklyn, NY (US); Alek Aronov, Brooklyn, NY (US); Michael Kamor, North Massapequa, NY (US); Renjith Mathew, New Hyde Park, NY (US)

(73) Assignee: Leviton Manufacturing Company, Inc., Melville, NY (US)

( * ) Notice: Subject to any disclaimer, the term of this patent is extended or adjusted under 35 U.S.C. 154(b) by 0 days.

(21) Appl. No.: 15/701,274

(22) Filed: Sep. 11, 2017

(65) Prior Publication Data

US 2018/0024179 A1 Jan. 25, 2018

Related U.S. Application Data

(63) Continuation of application No. 14/690,247, filed on Apr. 17, 2015, now Pat. No. 9,759,758, which is a (Continued)

(51) Int. Cl.
*G01R 31/02* (2006.01)
*G01R 31/327* (2006.01)
(Continued)

(52) U.S. Cl.
CPC ....... *G01R 31/025* (2013.01); *G01R 31/3277* (2013.01); *G01R 35/00* (2013.01); *H02H 3/335* (2013.01)

(58) Field of Classification Search
CPC ........ G01R 19/155; G01R 19/14; G01R 1/22; G01R 1/06788; G01R 31/041
(Continued)

(56) References Cited

U.S. PATENT DOCUMENTS 1,770,398 A 7/1930 Gallop et al.
1,870,810 A 8/1932 Hoard
(Continued)

FOREIGN PATENT DOCUMENTS

CA 2383738 A1 10/2002
DE 29519212 U1 1/1996
(Continued)

OTHER PUBLICATIONS

"Health Care Facilities Wiring Device Products Bulletin", Leviton Mfg. Co., Inc., pub., Jul. 2006, 24 pgs.
(Continued)

*Primary Examiner* — Christopher P McAndrew
(74) *Attorney, Agent, or Firm* — Foley & Lardner LLP

(57) ABSTRACT

An apparatus includes an interruption circuit in a power delivery path, and a fault detection circuit configured to provide a fault signal to selectively cause the interruption circuit to interrupt power delivery, wherein the fault detection circuit includes a fault detection integrated circuit and a sensing coil configured to sense a differential current between a phase conductive path and a neutral conductive path in the power delivery path. A processor is configured to selectively control a fault simulation circuit to simulate a fault in the power delivery path, detect a response of the fault detection circuit to the simulated fault, and determine if the response of the fault detection circuit is an expected response. The processor provides an override signal to the interruption circuit to prevent the interruption circuit from receiving a fault signal from the fault detection circuit during, and for a predetermined time after, the simulated fault.

6 Claims, 6 Drawing Sheets

Related U.S. Application Data continuation-in-part of application No. 14/262,411, filed on Apr. 25, 2014, now abandoned.

(60) Provisional application No. 62/044,710, filed on Sep. 2, 2014.

(51) Int. Cl.
 H02H 3/33 (2006.01)
 G01R 35/00 (2006.01)

(58) Field of Classification Search
 USPC .......................................................... 324/133
 See application file for complete search history.

(56) References Cited

U.S. PATENT DOCUMENTS

| | | |
|---|---|---|
| 1,967,110 A | 7/1934 | Bergvall |
| 2,309,433 A | 1/1943 | Anderson |
| 3,252,086 A | 5/1966 | Lundstrom |
| 3,259,802 A | 7/1966 | Steen |
| 3,611,044 A | 10/1971 | Osterhout et al. |
| 3,668,474 A | 6/1972 | Knox |
| 3,733,520 A | 5/1973 | Schei |
| 3,904,859 A | 9/1975 | Poncelet |
| 4,044,295 A * | 8/1977 | Ferraiolo ............... H02H 7/12 363/54 |
| 4,174,530 A | 11/1979 | Kresge et al. |
| 4,240,124 A | 12/1980 | Westrom |
| 4,314,300 A | 2/1982 | Griffith |
| 4,356,443 A | 10/1982 | Emery |
| 4,376,243 A | 3/1983 | Renn et al. |
| 4,400,754 A | 8/1983 | Schweickardt |
| 4,455,654 A | 6/1984 | Bhaskar et al. |
| 4,466,071 A | 8/1984 | Russell, Jr. |
| 4,472,754 A | 9/1984 | Mizukoshi et al. |
| 4,520,239 A | 5/1985 | Schwartz |
| 4,658,322 A | 4/1987 | Rivera |
| 4,685,634 A | 8/1987 | Schwartz |
| 4,705,342 A | 11/1987 | Schwartz |
| 4,707,759 A | 11/1987 | Bodkin |
| 4,726,991 A | 2/1988 | Hyatt et al. |
| 4,742,422 A | 5/1988 | Tigges |
| 4,751,608 A | 6/1988 | Schultz |
| 4,851,782 A | 7/1989 | Jeerings et al. |
| 4,853,818 A | 8/1989 | Emery et al. |
| 4,869,688 A | 9/1989 | Merio |
| 4,878,144 A | 10/1989 | Nebon |
| 4,908,730 A | 3/1990 | Westrom |
| 4,931,894 A | 6/1990 | Legatti |
| 4,933,630 A | 6/1990 | Dupraz |
| 5,121,282 A | 6/1992 | White |
| 5,136,458 A | 8/1992 | Durivage, III |
| 5,175,403 A | 12/1992 | Hamm et al. |
| 5,185,684 A | 2/1993 | Beihoff et al. |
| 5,185,686 A | 2/1993 | Hansen et al. |
| 5,202,662 A | 4/1993 | Bienwald et al. |
| 5,206,596 A | 4/1993 | Beihoff et al. |
| 5,208,723 A | 5/1993 | Jenne |
| 5,210,676 A | 5/1993 | Mashikian |
| 5,214,560 A | 5/1993 | Jensen |
| 5,223,795 A | 6/1993 | Blades |
| 5,224,006 A | 6/1993 | MacKenzie et al. |
| 5,233,498 A | 8/1993 | Kansala |
| 5,270,900 A | 12/1993 | Alden et al. |
| 5,280,404 A | 1/1994 | Ragsdale |
| 5,309,310 A | 5/1994 | Baer et al. |
| 5,363,047 A | 11/1994 | Dresti et al. |
| 5,383,085 A | 1/1995 | Boy et al. |
| 5,386,183 A | 1/1995 | Cronvich et al. |
| 5,394,374 A | 2/1995 | Ishimura et al. |
| 5,418,678 A | 5/1995 | McDonald |
| 5,432,455 A | 7/1995 | Blades |
| 5,434,509 A | 7/1995 | Blades |
| 5,459,630 A | 10/1995 | MacKenzie et al. |
| 5,475,609 A | 12/1995 | Apothaker |
| 5,477,412 A | 12/1995 | Neiger et al. |
| 5,504,306 A | 4/1996 | Russell et al. |
| 5,519,561 A | 5/1996 | Mrenna et al. |
| 5,559,663 A | 9/1996 | Tanaka et al. |
| 5,561,605 A | 10/1996 | Zuercher et al. |
| 5,590,012 A | 12/1996 | Dollar, II |
| 5,594,613 A | 1/1997 | Woodworth et al. |
| 5,596,308 A | 1/1997 | Bock |
| 5,600,524 A | 2/1997 | Neiger et al. |
| 5,617,288 A | 4/1997 | Zaretsky |
| 5,654,857 A | 8/1997 | Gershen |
| 5,682,101 A | 10/1997 | Brooks et al. |
| 5,706,159 A | 1/1998 | Dollar et al. |
| 5,708,548 A | 1/1998 | Greeve et al. |
| 5,715,125 A | 2/1998 | Neiger et al. |
| 5,729,145 A | 3/1998 | Blades |
| 5,781,393 A | 7/1998 | Tabib-Azar et al. |
| 5,784,753 A | 7/1998 | Kaczmarz et al. |
| 5,786,974 A | 7/1998 | Zaretsky |
| 5,805,397 A | 9/1998 | MacKenzie |
| 5,805,398 A | 9/1998 | Rae |
| 5,815,352 A | 9/1998 | MacKenzie |
| 5,818,237 A | 10/1998 | Zuercher et al. |
| 5,818,671 A | 10/1998 | Seymour et al. |
| 5,825,598 A | 10/1998 | Dickens et al. |
| 5,825,599 A | 10/1998 | Rosenbaum |
| 5,834,940 A | 11/1998 | Brooks et al. |
| 5,835,321 A | 11/1998 | Elms et al. |
| 5,839,092 A | 11/1998 | Erger et al. |
| 5,847,913 A | 12/1998 | Turner et al. |
| 5,875,087 A | 2/1999 | Spencer et al. |
| 5,892,669 A | 4/1999 | Shin |
| 5,901,027 A | 5/1999 | Ziegler et al. |
| 5,933,305 A | 8/1999 | Schmalz et al. |
| 5,940,256 A | 8/1999 | MacKenzie et al. |
| 5,946,179 A | 8/1999 | Fleege et al. |
| 5,956,218 A | 9/1999 | Berthold |
| 5,963,406 A | 10/1999 | Neiger et al. |
| 5,969,920 A | 10/1999 | MacKenzie |
| 5,978,191 A | 11/1999 | Bonniau et al. |
| 5,982,593 A | 11/1999 | Kimblin et al. |
| 5,982,596 A | 11/1999 | Spencer et al. |
| 5,986,860 A | 11/1999 | Scott |
| 5,999,384 A | 12/1999 | Chen et al. |
| 6,040,967 A | 3/2000 | Disalvo |
| 6,052,265 A | 4/2000 | Zaretsky et al. |
| 6,052,266 A | 4/2000 | Aromin |
| 6,057,997 A | 5/2000 | MacKenzie et al. |
| 6,069,781 A | 5/2000 | Wingate et al. |
| 6,088,205 A | 7/2000 | Neiger et al. |
| 6,094,128 A | 7/2000 | Bennett et al. |
| 6,111,733 A | 8/2000 | Neiger et al. |
| 6,118,639 A | 9/2000 | Goldstein |
| 6,128,169 A | 10/2000 | Neiger et al. |
| 6,160,692 A | 12/2000 | Zaretsky |
| 6,169,405 B1 | 1/2001 | Baltzer et al. |
| 6,172,865 B1 | 1/2001 | Boy et al. |
| 6,191,589 B1 | 2/2001 | Clunn |
| 6,195,241 B1 | 2/2001 | Brooks et al. |
| 6,198,611 B1 | 3/2001 | MacBeth |
| 6,211,770 B1 | 4/2001 | Coyle |
| 6,218,844 B1 | 4/2001 | Wong et al. |
| 6,226,161 B1 | 5/2001 | Neiger et al. |
| 6,246,556 B1 | 6/2001 | Haun et al. |
| 6,246,558 B1 | 6/2001 | Disalvo et al. |
| 6,252,488 B1 | 6/2001 | Ziegler et al. |
| 6,253,121 B1 | 6/2001 | Cline et al. |
| 6,259,996 B1 | 7/2001 | Haun et al. |
| 6,262,550 B1 | 7/2001 | Kliman et al. |
| 6,262,871 B1 | 7/2001 | Nemir et al. |
| 6,266,219 B1 | 7/2001 | MacBeth et al. |
| 6,275,044 B1 | 8/2001 | Scott |
| 6,282,070 B1 | 8/2001 | Ziegler et al. |
| 6,292,337 B1 | 9/2001 | Legatti et al. |
| 6,313,641 B1 * | 11/2001 | Brooks ............... G01R 31/025 324/424 |
| 6,339,525 B1 | 1/2002 | Neiger et al. |
| 6,342,998 B1 | 1/2002 | Bencivenga et al. |

(56) References Cited

U.S. PATENT DOCUMENTS

| | | |
|---|---|---|
| 6,362,628 B2 | 3/2002 | MacBeth et al. |
| 6,370,001 B1 | 4/2002 | MacBeth |
| 6,373,257 B1 | 4/2002 | MacBeth et al. |
| 6,377,055 B1 | 4/2002 | MacBeth et al. |
| 6,388,849 B1 | 5/2002 | Rae |
| 6,407,893 B1 | 6/2002 | Neiger et al. |
| 6,417,671 B1 | 7/2002 | Tiemann |
| 6,421,214 B1 | 7/2002 | Packard et al. |
| 6,421,218 B1 | 7/2002 | Vo et al. |
| 6,421,618 B1 | 7/2002 | Kliman et al. |
| 6,426,632 B1 | 7/2002 | Clunn |
| 6,426,634 B1 | 7/2002 | Clunn et al. |
| 6,433,977 B1 | 8/2002 | MacBeth |
| 6,433,978 B1 | 8/2002 | Neiger et al. |
| 6,437,700 B1 | 8/2002 | Herzfeld et al. |
| 6,456,471 B1 | 9/2002 | Haun et al. |
| 6,462,318 B2 | 10/2002 | Furuuchi et al. |
| 6,472,882 B1 | 10/2002 | Tiemann et al. |
| 6,502,265 B2 | 1/2003 | Blair et al. |
| 6,504,692 B1 | 1/2003 | MacBeth et al. |
| 6,522,509 B1 | 2/2003 | Engel et al. |
| 6,522,510 B1 | 2/2003 | Finlay et al. |
| 6,532,424 B1 | 3/2003 | Haun et al. |
| 6,538,862 B1 | 3/2003 | Mason et al. |
| 6,538,863 B1 | 3/2003 | MacBeth |
| 6,545,574 B1 | 4/2003 | Seymour et al. |
| 6,556,395 B1 | 4/2003 | Chan et al. |
| 6,567,250 B1 | 5/2003 | Haun et al. |
| 6,570,392 B2 | 5/2003 | MacBeth et al. |
| 6,577,484 B1 | 6/2003 | MacBeth et al. |
| 6,606,232 B1 | 8/2003 | Vo et al. |
| 6,608,547 B1 | 8/2003 | Greier et al. |
| 6,608,741 B1 | 8/2003 | MacBeth |
| 6,621,388 B1 | 9/2003 | MacBeth |
| 6,628,487 B1 | 9/2003 | MacBeth |
| 6,633,467 B2 | 10/2003 | MacBeth et al. |
| 6,636,403 B2 | 10/2003 | McLoughlin et al. |
| 6,639,769 B2 | 10/2003 | Neiger et al. |
| 6,642,832 B2 | 11/2003 | Pellon et al. |
| 6,654,219 B1 | 11/2003 | Romano et al. |
| 6,671,150 B2 | 12/2003 | Elms et al. |
| 6,674,289 B2 | 1/2004 | MacBeth |
| 6,683,158 B2 | 1/2004 | Springer et al. |
| 6,692,270 B2 | 2/2004 | Bencivenga et al. |
| 6,693,779 B2 | 2/2004 | Disalvo |
| 6,707,651 B2 | 3/2004 | Elms et al. |
| 6,717,782 B2 | 4/2004 | Disalvo et al. |
| 6,720,872 B1 | 4/2004 | Engel et al. |
| 6,731,483 B2 | 5/2004 | Mason et al. |
| 6,762,920 B2 | 7/2004 | Parker |
| 6,782,329 B2 | 8/2004 | Scott |
| 6,785,104 B2 | 8/2004 | Tallman et al. |
| 6,789,209 B1 | 9/2004 | Suzuki et al. |
| 6,798,209 B2 | 9/2004 | Lavoie et al. |
| 6,798,628 B1 | 9/2004 | MacBeth |
| 6,807,035 B1 | 10/2004 | Baldwin et al. |
| 6,807,036 B2 | 10/2004 | Baldwin |
| 6,810,069 B2 | 10/2004 | Kojovic et al. |
| 6,831,819 B2 | 12/2004 | Nemir et al. |
| 6,839,208 B2 | 1/2005 | MacBeth et al. |
| 6,856,498 B1 | 2/2005 | Finlay, Sr. |
| 6,864,766 B2 | 3/2005 | Disalvo et al. |
| 6,873,158 B2 | 3/2005 | MacBeth |
| 6,876,528 B2 | 4/2005 | MacBeth |
| 6,888,708 B2 | 5/2005 | Brungs et al. |
| 6,900,972 B1 | 5/2005 | Chan et al. |
| 6,937,027 B2 | 8/2005 | Koo et al. |
| 6,943,558 B2 | 9/2005 | Hale et al. |
| 6,972,572 B2 | 12/2005 | Mernyk et al. |
| 6,972,937 B1 | 12/2005 | MacBeth et al. |
| 6,980,005 B2 | 12/2005 | Finlay et al. |
| 6,987,389 B1 | 1/2006 | MacBeth et al. |
| 6,999,289 B2 | 2/2006 | MacBeth et al. |
| 7,003,435 B2 | 2/2006 | Kolker et al. |
| 7,009,406 B2 | 3/2006 | Naidu et al. |
| 7,012,500 B2 | 3/2006 | Chan et al. |
| 7,031,125 B2 | 4/2006 | Germain et al. |
| 7,035,066 B2 | 4/2006 | McMahon et al. |
| 7,049,910 B2 | 5/2006 | Campolo et al. |
| 7,064,944 B2 | 6/2006 | Kim et al. |
| 7,068,045 B2 | 6/2006 | Zuercher et al. |
| 7,082,021 B2 | 7/2006 | Chan et al. |
| 7,110,864 B2 | 9/2006 | Restrepo et al. |
| 7,133,266 B1 | 11/2006 | Finlay |
| 7,149,065 B2 | 12/2006 | Baldwin et al. |
| 7,154,718 B1 | 12/2006 | Finlay et al. |
| 7,161,775 B2 | 1/2007 | Schmalz |
| 7,161,786 B2 | 1/2007 | Bencivenga et al. |
| 7,173,428 B2 | 2/2007 | Hurwicz |
| 7,173,799 B1 | 2/2007 | Weeks et al. |
| 7,177,129 B2 | 2/2007 | Arenz et al. |
| 7,180,299 B2 | 2/2007 | Mernyk et al. |
| 7,180,717 B2 | 2/2007 | Kojovic et al. |
| 7,187,526 B2 | 3/2007 | Disalvo |
| 7,190,562 B2 | 3/2007 | Pellon et al. |
| 7,195,500 B2 | 3/2007 | Huang et al. |
| 7,212,386 B1 | 5/2007 | Finlay et al. |
| 7,215,520 B2 | 5/2007 | Elms et al. |
| 7,227,441 B2 | 6/2007 | Skendzic et al. |
| 7,242,566 B2 | 7/2007 | Yegin et al. |
| 7,253,603 B2 | 8/2007 | Kovanko et al. |
| 7,253,629 B1 | 8/2007 | Richards et al. |
| 7,253,637 B2 | 8/2007 | Dvorak et al. |
| 7,253,640 B2 | 8/2007 | Engel et al. |
| 7,253,996 B2 | 8/2007 | Elms et al. |
| 7,259,568 B2 | 8/2007 | Mernyk et al. |
| 7,263,637 B2 | 8/2007 | Ha et al. |
| 7,263,640 B2 | 8/2007 | Kobayashi |
| 7,263,996 B2 | 9/2007 | Yung Ho |
| 7,265,956 B2 | 9/2007 | Huang |
| 7,268,559 B1 | 9/2007 | Chen et al. |
| 7,268,989 B2 | 9/2007 | Parker et al. |
| 7,282,921 B2 | 10/2007 | Sela et al. |
| 7,283,340 B1 | 10/2007 | Finlay et al. |
| 7,289,306 B2 | 10/2007 | Huang |
| 7,295,415 B2 | 11/2007 | Huang et al. |
| 7,298,598 B1 | 11/2007 | Morgan et al. |
| 7,304,829 B2 | 12/2007 | Nadipuram et al. |
| 7,307,820 B2 | 12/2007 | Henson et al. |
| 7,309,993 B2 | 12/2007 | Driehorn et al. |
| 7,312,964 B2 | 12/2007 | Tchernobrivets |
| 7,315,437 B2 | 1/2008 | Bonilla et al. |
| 7,319,574 B2 | 1/2008 | Engel |
| 7,321,227 B2 | 1/2008 | Fritsch et al. |
| 7,333,920 B2 | 2/2008 | Kolker et al. |
| 7,349,188 B2 | 3/2008 | Zuercher et al. |
| 7,359,168 B2 | 4/2008 | Elms et al. |
| 7,362,552 B2 | 4/2008 | Elms et al. |
| 7,368,918 B2 | 5/2008 | Henson et al. |
| 7,372,678 B2 | 5/2008 | Disalvo et al. |
| 7,403,129 B2 | 7/2008 | Zhou et al. |
| 7,405,569 B2 | 7/2008 | Hagel et al. |
| 7,411,766 B1 | 8/2008 | Huang et al. |
| 7,440,245 B2 | 10/2008 | Miller et al. |
| 7,440,250 B2 | 10/2008 | Terhorst |
| 7,441,173 B2 | 10/2008 | Restrepo et al. |
| 7,443,644 B2 | 10/2008 | Sung |
| 7,460,346 B2 | 12/2008 | Deshpande et al. |
| 7,463,037 B2 | 12/2008 | Henson et al. |
| 7,486,492 B2 | 2/2009 | Elms |
| 7,492,163 B2 | 2/2009 | Restrepo et al. |
| 7,492,562 B2 | 2/2009 | Evans et al. |
| 7,518,840 B2 | 4/2009 | Elms |
| 7,525,402 B2 | 4/2009 | Gao |
| 7,535,234 B2 | 5/2009 | Mernyk et al. |
| 7,538,993 B2 | 5/2009 | Huang et al. |
| 7,558,033 B2 | 7/2009 | Zhou et al. |
| 7,570,465 B2 | 8/2009 | Beatty et al. |
| 7,598,828 B1 | 10/2009 | Weeks et al. |
| 7,619,860 B1 | 11/2009 | Finlay et al. |
| 7,633,729 B2 | 12/2009 | Oldenburg et al. |
| 7,692,904 B2 | 4/2010 | Li et al. |
| 7,697,252 B2 | 4/2010 | Chan et al. |
| 7,719,804 B1 | 5/2010 | Morgan et al. |

(56) References Cited

U.S. PATENT DOCUMENTS

| | | | |
|---|---|---|---|
| 7,733,617 B2 | 6/2010 | Baldwin et al. | |
| 7,751,160 B1 | 7/2010 | Radosavljevic et al. | |
| 7,800,874 B2 | 9/2010 | Disalvo et al. | |
| 7,834,636 B2 * | 11/2010 | Lewinski | G01R 31/025 324/509 |
| 7,843,197 B2 | 11/2010 | Finlay et al. | |
| 7,864,492 B2 | 1/2011 | Restrepo et al. | |
| 7,925,458 B2 | 4/2011 | Kolker et al. | |
| 7,944,654 B2 | 5/2011 | Scott et al. | |
| 7,973,535 B2 * | 7/2011 | Lewinski | G01R 31/025 324/509 |
| 7,986,148 B2 | 7/2011 | Mernyk et al. | |
| 7,986,501 B2 | 7/2011 | Kamor et al. | |
| 8,018,235 B2 * | 9/2011 | Lewinski | G01R 31/025 324/509 |
| 8,023,235 B2 | 9/2011 | Bilac et al. | |
| 8,054,591 B2 | 11/2011 | Changali et al. | |
| 8,054,592 B2 | 11/2011 | Rivers, Jr. | |
| 8,081,001 B2 | 12/2011 | Hooper et al. | |
| 8,299,799 B2 | 10/2012 | Finlay et al. | |
| 8,311,785 B2 * | 11/2012 | Lewinski | G06F 17/5036 324/509 |
| 8,335,062 B2 | 12/2012 | Haines et al. | |
| 8,384,392 B2 * | 2/2013 | Lewinski | G01R 35/00 324/509 |
| 8,547,126 B2 | 10/2013 | Ostrovsky et al. | |
| 8,599,522 B2 | 12/2013 | Aronov et al. | |
| 8,599,523 B1 * | 12/2013 | Ostrovsky | G01R 31/025 361/45 |
| 8,760,824 B2 | 6/2014 | Armstrong | |
| 8,861,146 B2 * | 10/2014 | McMahon | H01H 47/22 361/42 |
| 9,239,368 B2 * | 1/2016 | Lewinski | G01R 35/00 |
| 2001/0015686 A1 | 8/2001 | McLoughlin | |
| 2001/0055187 A1 | 12/2001 | McLoughlin et al. | |
| 2002/0008597 A1 | 1/2002 | Otsuka et al. | |
| 2002/0033701 A1 | 3/2002 | MacBeth et al. | |
| 2002/0078511 A1 | 6/2002 | Blair et al. | |
| 2002/0135957 A1 | 9/2002 | Chan et al. | |
| 2002/0140432 A1 * | 10/2002 | Jones | G01R 31/025 324/509 |
| 2002/0181175 A1 | 12/2002 | Baldwin | |
| 2003/0072113 A1 | 4/2003 | Wong et al. | |
| 2004/0100274 A1 | 5/2004 | Gloster et al. | |
| 2004/0252425 A1 | 12/2004 | Baldwin et al. | |
| 2005/0036250 A1 | 2/2005 | Asano | |
| 2005/0052809 A1 | 3/2005 | Evans et al. | |
| 2005/0063109 A1 | 3/2005 | Baldwin | |
| 2005/0117264 A1 | 6/2005 | Aromin | |
| 2005/0203672 A1 | 9/2005 | Restrepo et al. | |
| 2005/0212522 A1 | 9/2005 | Finlay et al. | |
| 2005/0264427 A1 | 12/2005 | Zeng et al. | |
| 2005/0286184 A1 | 12/2005 | Campolo | |
| 2005/0286185 A1 | 12/2005 | Henson et al. | |
| 2006/0125622 A1 | 6/2006 | Baldwin et al. | |
| 2006/0171085 A1 | 8/2006 | Keating | |
| 2006/0227469 A1 | 10/2006 | Parker et al. | |
| 2007/0014068 A1 | 1/2007 | Huang et al. | |
| 2007/0030608 A1 | 2/2007 | Baldwin et al. | |
| 2007/0086127 A1 | 4/2007 | Huang | |
| 2007/0091520 A1 | 4/2007 | Angelides et al. | |
| 2007/0146945 A1 | 6/2007 | Zhang et al. | |
| 2007/0159738 A1 | 7/2007 | Natili et al. | |
| 2007/0165342 A1 | 7/2007 | Elms | |
| 2007/0208520 A1 | 9/2007 | Zhang et al. | |
| 2007/0208981 A1 | 9/2007 | Restrepo et al. | |
| 2007/0210787 A1 | 9/2007 | Ebenezer et al. | |
| 2007/0227506 A1 | 10/2007 | Perryman et al. | |
| 2007/0236208 A1 | 10/2007 | Kojovic et al. | |
| 2007/0247767 A1 | 10/2007 | Zhang | |
| 2007/0252603 A1 | 11/2007 | Restrepo et al. | |
| 2007/0262780 A1 | 11/2007 | Mernyk et al. | |
| 2007/0279814 A1 | 12/2007 | Bonilla et al. | |
| 2007/0290695 A1 | 12/2007 | Mahon | |
| 2008/0002313 A1 | 1/2008 | Disalvo et al. | |
| 2008/0007879 A1 | 1/2008 | Zaretsky et al. | |
| 2008/0012681 A1 | 1/2008 | Kadar et al. | |
| 2008/0013227 A1 | 1/2008 | Mernyk et al. | |
| 2008/0013237 A1 | 1/2008 | Moadel et al. | |
| 2008/0013239 A1 | 1/2008 | Kopelman | |
| 2008/0022153 A1 | 1/2008 | Wang et al. | |
| 2008/0024140 A1 | 1/2008 | Henson et al. | |
| 2008/0091308 A1 | 4/2008 | Henson et al. | |
| 2008/0106254 A1 | 5/2008 | Kojovic | |
| 2008/0106268 A1 * | 5/2008 | Lewinski | G01R 31/025 324/509 |
| 2008/0106269 A1 * | 5/2008 | Lewinski | G01R 31/025 324/509 |
| 2008/0106831 A1 * | 5/2008 | Lewinski | H02H 3/335 361/42 |
| 2008/0106832 A1 | 5/2008 | Restrepo et al. | |
| 2008/0106833 A1 * | 5/2008 | Lewinski | G01R 31/025 361/49 |
| 2008/0109193 A1 * | 5/2008 | Lewinski | G06F 17/5036 703/4 |
| 2008/0140354 A1 | 6/2008 | Kolker et al. | |
| 2008/0204949 A1 | 8/2008 | Zhou et al. | |
| 2008/0204955 A1 | 8/2008 | Parker et al. | |
| 2009/0040667 A1 | 2/2009 | Disalvo et al. | |
| 2009/0086389 A1 | 4/2009 | Huang et al. | |
| 2009/0086390 A1 | 4/2009 | Huang | |
| 2009/0161271 A1 | 6/2009 | Huang et al. | |
| 2009/0198459 A1 | 8/2009 | Bilac et al. | |
| 2009/0207535 A1 | 8/2009 | Mernyk et al. | |
| 2009/0248329 A1 | 10/2009 | Restrepo | |
| 2010/0013491 A1 | 1/2010 | Hooper et al. | |
| 2010/0073829 A1 | 3/2010 | Baxter et al. | |
| 2010/0073839 A1 | 3/2010 | Baxter et al. | |
| 2010/0085206 A1 | 4/2010 | Nayak et al. | |
| 2010/0149711 A1 | 6/2010 | Larson et al. | |
| 2010/0295568 A1 | 11/2010 | Ostrovsky et al. | |
| 2011/0032646 A1 * | 2/2011 | Lewinski | G01R 31/025 361/45 |
| 2011/0181296 A1 | 7/2011 | Kolker et al. | |
| 2012/0007621 A1 | 1/2012 | Yue et al. | |
| 2012/0119918 A1 * | 5/2012 | Williams | G01R 31/3277 340/664 |
| 2012/0140369 A1 | 6/2012 | Radosavljevic et al. | |
| 2012/0154972 A1 * | 6/2012 | McMahon | H01H 47/22 361/187 |
| 2013/0027819 A1 | 1/2013 | Aronov et al. | |
| 2013/0141110 A1 * | 6/2013 | Lewinski | H02H 3/335 324/509 |
| 2014/0092503 A1 | 4/2014 | Ostrovsky | |
| 2014/0197856 A1 | 7/2014 | Ostrovsky et al. | |
| 2014/0218044 A1 | 8/2014 | Ostrovsky et al. | |
| 2014/0347768 A1 | 11/2014 | Batko et al. | |
| 2015/0309103 A1 | 10/2015 | Ostrovsky et al. | |

FOREIGN PATENT DOCUMENTS

| | | |
|---|---|---|
| DE | 29600914 U1 | 3/1996 |
| EP | 0 186 939 A2 | 7/1986 |
| EP | 0 649 207 A1 | 4/1995 |
| EP | 0 677 909 A2 | 10/1995 |
| FR | 2444359 A1 | 11/1980 |
| JP | 2000-312434 A | 11/2000 |
| JP | 2013-213750 A | 10/2013 |
| WO | WO-00/14842 | 3/2000 |
| WO | WO-2009/097469 | 8/2009 |

OTHER PUBLICATIONS

"Leviton's new uninterruptible power supply (UPS) 'strip' models", Leviton Mfg. Co., Inc., Product Bulletin for Catalog Nos. U0330-KO, U0500-SKO, pub., in 2000, 2 pgs., no month.

"Metal oxide varistor degradation", Leviton Mfg. Co., Inc., pub., Mar. 2004, 7 pgs.

"Multimedia residential surge protector panel", Leviton Mfg. Co., Inc., Product Bulletin for Catalog No. 5111-PTC & 51110-CT8, pub., in 2003, 2 pgs., no month.

(56) References Cited

OTHER PUBLICATIONS

"Power quality products", Leviton Mfg. Co., Inc., pub., in 2003, 16 pgs., no. month.
"Technical and applications manual for power quality products", Leviton Mfg. Co., Inc., pub., in 2003, 66 pgs., no month.
"Technology for detecting and monitoring conditions that could cause electrical wiring system fires," UL Underwriters Laboratories Inc., Sep. 1995, pp. 1-161, with Appendix A, and Appendix B.
Final Office Action issued in U.S. Appl. No. 11/756,362 dated May 20, 2010.
Final Office Action issued in U.S. Appl. No. 13/194,386 dated Apr. 26, 2013.
International Search Report and Written Opinion of the International Searching Authority dated Jul. 23, 2015, received in corresponding International Application No. PCT/US2015/027288.
International Search Report issued in International Application No. PCT/US1999/19716 dated Jan. 12, 2000.
International Search Report issued in International Application No. PCT/US2009/032502 dated Jun. 29, 2009.
Non-Final Office Action issued in U.S. Appl. No. 11/756,362 dated Dec. 17, 2009.
Non-Final Office Action issued in U.S. Appl. No. 12/845,924 dated Feb. 6, 2013.
Non-Final Office Action issued in U.S. Appl. No. 13/194,386 dated Oct. 5, 2012.
Non-Final Office Action issued in U.S. Appl. No. 13/194,723 dated Jan. 2, 2013.
Notice of Allowance issued in U.S. Appl. No. 12/408,229 dated Sep. 19, 2011 including search history dated (Now U.S. Pat. No. 8,081,001).
Notice of Allowance issued in U.S. Appl. No. 12/845,924 dated May 29, 2013.
Notice of Allowance issued in U.S. Appl. No. 13/194,386 dated Jul. 30, 2013.
Notice of Allowance issued in U.S. Appl. No. 13/194,723 dated Jul. 18, 2013.
Office Action dated Oct. 9, 2015, received in corresponding U.S. Appl. No. 14/030,999.
PCT International Search Report and Written Opinion issued in International Application No. PCT/US2012/027094 dated Jan. 23, 2013.
Roberts, Earl W. "Ideas-Ideas-Ideas," IAEI Magazine, pub., Jan.-Feb. 2006, http://www.iaei.org/magazine/2006/01/ideas-ideas-ideas/.
Supplemental Notice of Allowability issued in U.S. Appl. No. 12/408,229 dated Nov. 2, 2011.
U.S. Notice of Allowance on U.S. Appl. No. 14/030,999 dated Mar. 15, 2017.
U.S. Notice of Allowance on U.S. Appl. No. 14/690,247 dated May 4, 2017.
U.S. Office Action on U.S. Appl. No. 14/030,999 dated Apr. 15, 2016.
U.S. Office Action on U.S. Appl. No. 14/030,999 dated Oct. 17, 2016.
U.S. Office Action on U.S. Appl. No. 14/262,411 dated May 6, 2016.
U.S. Office Action on U.S. Appl. No. 14/690,247 dated Apr. 28, 2016.
U.S. Office Action on U.S. Appl. No. 14/690,247 dated Jan. 10, 2017.
Non-Final Office Action on U.S. Appl. No. 15/650,369 dated May 13, 2019.

\* cited by examiner

GROUND FAULT DETECTOR

CROSS-REFERENCE TO RELATED PATENT APPLICATIONS

This application is a continuation application of U.S. patent application Ser. No. 14/690,247 filed Apr. 17, 2015 to Ostrovsky et al., titled "GROUND FAULT DETECTOR" which claims the benefit of U.S. patent application Ser. No. 14/262,411 filed Apr. 25, 2014 to Ostrovsky et al., titled "Ground fault Detector and Self-Test" and U.S. Provisional Patent Application 62/044,710 filed Sep. 2, 2014 to Ostrovsky et al., titled "Ground Fault Detector," the contents of which are incorporated herein by reference in their entirety.

BACKGROUND

A category of line monitors, such as power line monitors, includes the Ground Fault Circuit Interrupter (GFCI). To be commercially sold in the United States a GFCI should preferably be able to pass testing performed in accordance with Underwriter's Laboratory (UL) standards. For example, UL standard UL948 requires, among other things, that power be interrupted within a certain amount of time if a fault current level related to one of the electrical conductors (such as leakage current from one or more electrical conductors to ground) exceeds a specified threshold, and that power not be interrupted if a fault current is below another specified threshold. New techniques are needed to satisfy increasingly rigorous standards.

SUMMARY

One embodiment is an apparatus including an interruption circuit electrically connected in a power delivery path, the power delivery path including a phase conductive path and a neutral conductive path, and a fault detection circuit coupled to the interruption circuit and configured to provide a fault signal to selectively cause the interruption circuit to interrupt power delivery in at least one of the phase conductive path and the neutral conductive path, wherein the fault detection circuit includes a sensing coil configured to sense a differential current between the phase conductive path and the neutral conductive path, and further includes a comparator-type fault detection integrated circuit that compares the differential current to a threshold. The apparatus further includes a fault simulation circuit; and a processor coupled to the fault simulation circuit and the fault detection circuit. The processor is configured to selectively control the fault simulation circuit to simulate a fault in the power delivery path, detect a response of the fault detection circuit to the simulated fault, and determine if the response of the fault detection circuit is an expected response. The processor provides an override signal to the interruption circuit to prevent the interruption circuit from receiving a fault signal from the fault detection circuit during, and for a predetermined time after, the simulated fault.

The processor may be powered from the line side conductors. In some embodiments, the processor may be configured to receive an indication that the fault detection circuit has provided the fault signal, receive an indication that a reset button has been pushed, initiate a self-test including a fault simulation, and if the self-test passes, provide a release signal to an electronic switch component to unlatch and thereby allow the interruption circuit to remove an interruption of power delivery; and if the self-test does not pass, prevent the interruption circuit from removing the interruption of power delivery.

The apparatus may further include a silicon-controlled rectifier (SCR), wherein power delivery is interrupted by the latching of the SCR in a conductive state in response to a received fault signal, and wherein the SCR is powered from a rectified power signal, or from an alternating current power line, such that the SCR may only be latched during one power half-cycle. The processor is configured for this implementation to receive an indication that a manual reset button has been pushed, and initiate a self-test including self-testing in two power half-cycles of opposite polarity to ensure that the SCR will latch in response to a fault signal received during a self-test in one of the two power half-cycles.

The apparatus may further include a rectifier, wherein the processor is configured to, prior to initiating a fault simulation, determine the rate of zero crossings of an amplitude of the output of the rectifier to identify a failure of a component in the rectifier, and if a failure of a component in the rectifier is detected, the processor does not initiate a fault simulation.

One embodiment is an apparatus that includes an interruption circuit electrically connected in a power delivery path, the power delivery path including a phase conductive path and a neutral conductive path, and a fault detection circuit coupled to the interruption circuit and configured to provide a fault signal upon detection of a fault in the power delivery path. The apparatus further includes a fault simulation circuit which selectively causes a current imbalance between the phase conductive path and the neutral conductive path, and a processor coupled to the fault simulation circuit and the fault detection circuit. The processor is configured to selectively control the fault simulation circuit to cause a first current imbalance, such as to divert an amount of current from one of the phase conductive path and the neutral conductive path to simulate a fault, during a first power half-cycle, and detect a response of the fault detection circuit to the simulated fault.

The processor may selectively control the fault simulation circuit to cause the first current imbalance, such as by diverting an amount of current, starting at a predetermined time after the beginning of the first power half-cycle. The processor may selectively control the fault simulation circuit to cause a second current imbalance between the phase conductive path and the neutral conductive path during a second power half-cycle. The first power half-cycle and the second power half-cycle may have approximately opposite polarity. The end of the first power half-cycle and the beginning of the second power half-cycle may be separated in time by an even number of power half-cycles. The first power half-cycle may randomly be either a positive polarity or a negative polarity. The processor may control the fault simulation circuit to create the first current imbalance during a portion of the first power half-cycle and to cause the second current imbalance during a portion of the second power half-cycle, each portion beginning several milliseconds after the start of the respective half-cycle.

One embodiment is an apparatus that includes an interruption circuit electrically connected in a power delivery path, the power delivery path including a phase conductive path and a neutral conductive path, and a fault detection circuit coupled to the interruption circuit and configured to provide a fault signal to selectively cause the interruption circuit to interrupt power delivery in at least one of the phase conductive path and the neutral conductive path. The apparatus further includes a fault simulation circuit, and a processor coupled to the fault simulation circuit and the fault detection circuit. The processor selectively controls the fault simulation circuit to simulate a fault in the power delivery path and detect a response of the fault detection circuit to the simulated fault. A power circuit of the apparatus includes a solenoid coil, a rectifier, and a first resistor in parallel with the solenoid coil, wherein the processor and the fault detection circuit are powered from a line side of the power delivery path via the solenoid coil and rectifier, and the resistor is sized such that, if the solenoid coil is damaged, the resistor will not allow sufficient power for proper operation of both the processor and the fault detection circuit.

The apparatus may include a trigger circuit and a second resistor positioned between the fault detection circuit and the trigger circuit, wherein the processor is further configured to monitor a voltage across the second resistor during a simulated fault, and determine from an amplitude of the voltage whether the value of a resistance of the second resistor is within acceptable limits.

One embodiment is an apparatus that includes a connection device, preferably a switching device, that electrically connects line side conductors to load side conductors; a fault detection circuit to detect faults related to the load side conductors; and a processor that initiates and controls a simulation of a load side conductor fault and determines whether the fault detection circuit detects the resulting simulated fault. The fault detection circuit includes a sensing coil configured to sense a differential current between two line side conductors; and a comparator-type fault detection integrated circuit that compares the differential current to a threshold. The processor may be powered from the line side conductors. The processor may test components of the fault detection circuit for proper operation.

The apparatus may further include a solenoid coil, a rectifier, and a resistor in parallel with the solenoid coil, wherein the processor and the fault detection circuit are powered from the line side conductors via the solenoid coil and rectifier, and the resistor is sized such that, if the solenoid coil is damaged, the resistor will not allow sufficient power for proper operation of both the processor and the fault detection circuit.

The apparatus may further include a trigger circuit that causes the connection device to electrically disconnect the line side conductors from the load side conductors. A resistor may be positioned between the fault detection circuit and the trigger circuit; and the processor monitors a voltage across the resistor during a simulated fault and determines from an amplitude of the voltage whether the value of a resistance of the resistor is within acceptable limits. The trigger circuit may include an electronic switch component, and when a fault signal is received by the electronic switch component from the fault detection circuit or the processor, the electronic switch component activates and latches, the activation causing the connection device to electrically disconnect the line side conductors from the load side conductors. The processor may provide an override signal to the electronic switch component to prevent the electronic switch component from receiving a fault signal from the fault detection circuit during, and for a predetermined time after, the fault simulation. A reset button may become operational after the electronic switch component activates and latches thereby causing the connection device to electrically disconnect the line side conductors from the load side conductors, such that when the processor receives an indication that the reset button has been pushed, the processor initiates a self-test including a fault simulation.

The apparatus may further include a rectifier, and the processor, prior to initiating a fault simulation, determines the rate of zero crossings of an amplitude of the output of the rectifier to identify a failure of a component in the rectifier, and if a failure of a component in the rectifier is detected, the processor does not initiate a fault simulation.

The apparatus may further include a visual indicator, wherein the visual indicator is a first color when power is present on the load side conductors, and changes to a second color to indicate improper operation of the apparatus or a fault related to the load side conductors. The visual indicator may be a multi-color light-emitting diode. The visual indicator may be the output of a light pipe, and the apparatus may include a first light emitting diode (LED) powered by the load side conductors and emitting the first color; and a second LED powered by the line side conductors and controlled by the processor, the second LED emitting a third color; and the light pipe is configured to provide a combination of light from the first LED and the second LED as the visual indicator, and the second color is provided by a combination of the first color and the third color.

The processor may selectively cause an introduction of a current imbalance between two line side conductors, such as by controlling a diversion of current from a line side conductor, during a fault simulation. The processor may cause the introduction of a first current imbalance during a portion of a first power half-cycle and subsequently cause the introduction of a second current imbalance during a portion of a second power half-cycle. The first power half-cycle and the second power half-cycle may be separated in time by at least one power half-cycle. The first power half-cycle and the second power half-cycle may have approximately opposite polarity. For example, the time between the end of the first half-cycle and the beginning of the second half-cycle may be approximately zero, two, four, or other even number of half-cycles. The first power half-cycle may be randomly either a positive polarity or a negative polarity. The portion of the first power half-cycle and the portion of the second power half-cycle may each begin several milliseconds after the start of the respective half-cycle.

In some implementations, the apparatus further includes a diversion switch (e.g., a fault simulation switch), a first diode, a second diode, and a resistor. The processor controls the diversion by controlling the diversion switch. An anode of the first diode is electrically connected to a neutral conductor; an anode of the second diode is electrically connected to a power phase conductor; cathodes of the first diode and the second diode are electrically connected to a first end of the resistor; and the second end of the resistor is electrically connected to the diversion switch.

The processor may initiate a simulation the line side conductor fault at selective times based on the expiration of a timer. The processor may transition from a low power state to a higher power state upon the expiration of the timer. The timer may be internal or external to the processor. The expiration of the timer may generate an interrupt to the processor.

The apparatus may further include a manual test/reset input mechanism. When a request for a manual reset is received at the manual reset input mechanism, the processor initiates a fault simulation. Before or after the processor initiates a fault simulation, the processor may initiate a test of one or more components in the apparatus.

The processor may initiate a fault simulation when power is initially provided to the processor.

The apparatus may include a diode clamp across the sensing coil.

In one embodiment, an apparatus includes an interruption circuit electrically connected in a power delivery path, the power delivery path including a phase conductive path and a neutral conductive path. The apparatus further includes an SCR coupled to the interruption circuit and configured to cause the interruption circuit to interrupt power delivery in at least one of the phase conductive path and the neutral conductive path. The apparatus further includes a fault detection circuit coupled to the SCR and configured to provide a first trigger signal to the SCR, wherein the fault detection circuit includes a sensing coil configured to sense a differential current between the phase conductive path and the neutral conductive path, and a comparator-type fault detection IC that compares the differential current to a threshold. The apparatus further includes a processor coupled to the fault detection circuit and to the SCR, wherein the processor is configured to: identify when the fault detection circuit provides the first trigger signal, and provide a second trigger signal to the SCR at a subsequent time. The processor may further be configured to determine whether the SCR is able to cause the interruption circuit to interrupt power delivery upon receipt of the first trigger signal.

The determination of whether the SCR is able to cause the interruption circuit to interrupt power delivery may include a determination of whether the SCR is capable of being latched during a power half-cycle in which the first trigger signal is provided. The determination of whether the SCR is able to cause the interruption circuit to interrupt power delivery may include a determination of whether a voltage at the anode of the SCR is above a threshold. The determination of whether the SCR is able to cause the interruption circuit to interrupt power delivery may include a determination of whether a voltage of the phase conductive path is in a positive half-cycle or a negative half-cycle.

The processor may be further configured to monitor voltage or current of at least one circuit, wherein the determination of whether the SCR is able to cause the interruption circuit to interrupt power delivery includes a determination of whether there is a change in the monitored voltage or current.

The subsequent time may be during an opposite-polarity half-cycle of the phase conductive path following the half-cycle in which the first trigger signal is provided to the SCR.

The first trigger signal and second trigger signal may be received by the SCR through the same circuit. Alternatively, the first trigger signal and second trigger signal may be received by the SCR through different circuits.

BRIEF DESCRIPTION OF THE DRAWINGS

Other features will become apparent from the following detailed description considered in connection with the accompanying drawings. It is to be understood, however, that the drawings are designed for illustration and not as a definition of the limits of the invention. In the drawings, similar reference characters denote similar elements throughout the several views.

DETAILED DESCRIPTION

Figure 1:
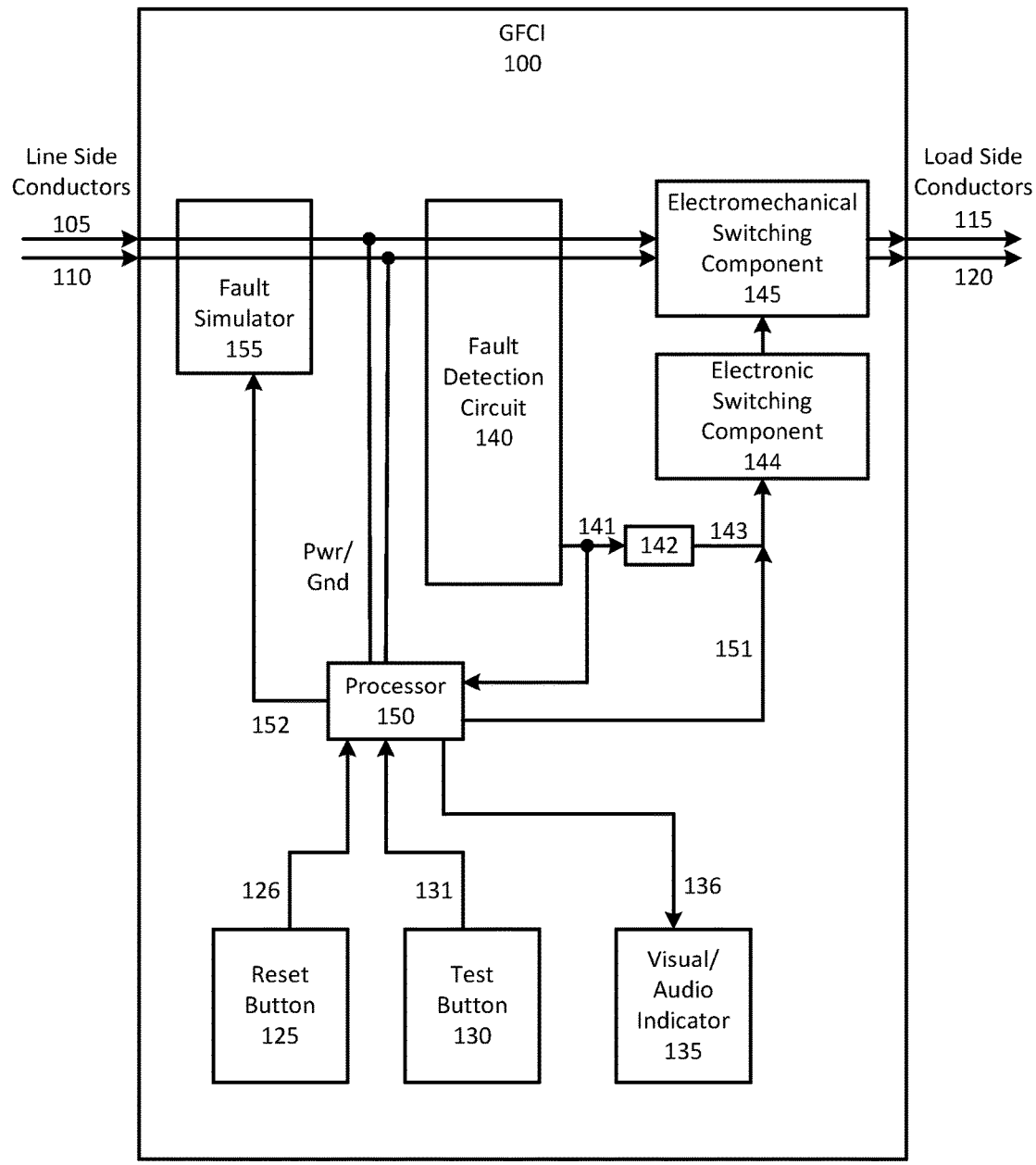
FIG. 1 is a block diagram representation of one embodiment of a GFCI according to this disclosure.

FIG. 1 is a block diagram illustrating some features of a GFCI 100 according to the teachings in this disclosure. FIG. 1 is presented by way of example for the purpose of discussion only, and is not to be interpreted as limiting the variations that may exist in the structure and/or function of GFCI 100. Examples of implementations of GFCI 100 will be described with respect to circuit diagrams in FIGS. 2 and 3. Other implementations will be apparent to one of ordinary skill in the art, and are encompassed in the concepts described in this disclosure.

Blocks in FIG. 1 generally represent functionality of one or more electronic or electromechanical components, including analog and/or digital electronic components, where digital components may include processing components that execute software and/or firmware instructions. The placement of the blocks with respect to each other is not necessarily representative of the physical placement of the corresponding components within GFCI 100. The blocks in FIG. 1 also do not signify any necessary physical division of components. Functionality of one block may be performed by components of another block. Thus, the blocks indicate functionality of physical components and not necessarily physical implementation.

Arrows in FIG. 1 are included to indicate directionality for the limited purpose of visually aiding in the understanding of some functionality of the blocks in FIG. 1. However, functionality is by no means limited by the directionality illustrated.

GFCI 100 is positioned in a path of power delivery to monitor the electrical conductors (referred to as "conductors" herein, and including phase and neutral conductors) delivering the power. The conductors are monitored for load-side faults such as ground faults (e.g., a full or partial short circuit of any one of the conductors to a ground potential) and cross-conductor faults (e.g., a full or partial short circuit between two or more conductors).

Line side conductors 105/110 traverse a portion of GFCI 100. Load side conductors 115/120 also traverse a portion of GFCI 100. In the case in which GFCI 100 is a terminating electrical outlet, the load side conductors 115/120 represent wiring to the outlet plugs, and also wiring between the outlet plugs and attached load(s). In the case in which GFCI 100 is a non-terminating outlet, load side conductors 115/120 additionally represent downstream wiring, including wiring to additional loads. In some implementations, GFCI 100 may not include an electrical outlet, and load side conductors 115/120 represent downstream wiring, including wiring to loads.

GFCI 100 includes a reset button 125, providing a signal 126 to a processor 150, and a test button 130 optionally providing a signal 131 to processor 150. GFCI 100 also includes a visual/audio indicator 135, controlled by one or more signals 136 from processor 150. Reset button 125, test button 130, and visual/audio indicator 135 (with their respective signals) will be described below in the context of their use.

A fault detection circuit 140 monitors line side conductors 105/110 to detect faults on load side conductors 115/120. Fault detection circuit 140 may include one or more coils adjacent to or surrounding one or more of the line side conductors 105/110. A fault in a load side conductor 115/120 is detected in fault detection circuit 140 by analyzing currents induced in the one or more coils. For example, fault detection circuit 140 may include an integrated circuit designed to perform such an analysis. When a fault is detected, fault detection circuit 140 provides a signal 141 via a circuit component 142 (e.g., a resistor) as a signal 143 to an electronic switching component 144, which controls a double-pole, single throw electromechanical switching component 145, which responds by disconnecting load side conductors 115/120 from line side conductors 105/110. Electromechanical switching component 145 is subsequently held open mechanically until manually released.

Processor 150 is powered from line side conductors 105/110, allowing processor 150 to function even when load side conductors 115/120 are disconnected from line side conductors 105/110. In one embodiment, powering processor 150 from line side conductors 105/110 allows processor 150 to function prior to the connection of load side conductors 115/120 to line side conductors 105/110 at startup or reset, thereby allowing processor 150 to power up to a functioning state, and then initiate and control a GFCI 100 self-test, within a prescribed time limit (e.g., five seconds) required by an applicable UL standard such as UL948.

Processor 150 controls the GFCI 100 self-test, causing a load side fault to be simulated by applying a low impedance on one or more of the line side conductors 105/110 and detecting an appropriate response from fault detection circuit 140 by way of monitoring signal 141. The simulated load side fault is introduced by way of fault simulator 155.

Fault simulator 155 responds to a signal 152 from processor 150 by activating electronic or electromechanical components in such a way as to cause it to appear that a fault exists on at least one of load side conductors 115/120. For example, fault simulator 155 may divert a portion of current from a line side conductor 105/110 to cause a difference between the current in different line side conductors 105/110. If fault detection circuit 140 detects the simulated fault and asserts signal 141 in response within a predefined time limit, processor 150 identifies that the self-test of the line side conductors 105/110 is successful. If, however, the test is not successfully completed, such as if fault detection circuit 140 does not assert signal 141, or does not assert signal 141 within a predefined time frame, processor 150 recognizes a failure of the self-test. To prevent a disruption in power during the test due to fault detection circuit 140 correctly detecting a simulated fault and causing electromechanical switching component 145 to open (i.e., by asserting signal 141 to electronic switching component 144), processor 150 provides a signal 151 to electronic switching component 144 to override signal 143. The terms "asserting" and "assert" in the context of a signal indicate providing an appropriate voltage, current, frequency (or other signal property) that indicates an active state of the signal. The active state may be, in one example, active low (e.g., 0-0.2 V) or active high (e.g., 0.8-1.0 V).

As a result of detecting a self-test failure, processor 150 may follow instructions to perform one or more of: storing an indication of self-test failure (e.g., in a memory device), transmitting an indication of self-test failure (e.g., via a wireless communication link or via power line communications to an external device), controlling visual/audio indicator 135 via signal 136 to indicate the failure, and controlling electromechanical switching component 145 to disconnect load side connectors 115/120 from line side connectors 105/110. An indication of self-test failure may include one or more of an indication of the occurrence, an indication of the specific test(s) that failed, a time stamp, a date stamp, or other information.

A self-test may include one or more self-test events. A single self-test event includes processor 150 asserting signal 152 to cause simulation of a fault by fault simulator 155, and monitoring signal 141 for detection of the fault by fault detection circuit 140. A self-test event may be controlled to selectively occur partway through a half cycle (e.g., after a certain percentage of the cycle period, or after a certain time). A self-test event may be timed to occur in a half cycle between zero crossings of the amplitude of the power in line side conductors 105/110. A self-test event may be timed to occur in a positive half cycle or in a negative half cycle. A self-test event may be timed to occur between zero crossings but randomly with respect to polarity, such that the self-test event occurs randomly in either a positive or negative half cycle. The ability to perform a self-test in a random polarity half-cycle allows for less processing time needed for a self-test event, in that it is not necessary to wait for a specific polarity of the power line. This ability is advantageous at initial startup to meet UL standard requirements for self-test within a certain time (e.g., within three seconds). Between self-tests, processor 150 may enter a low power state. Examples of low power states include wait, sleep, and halt states. The ability to perform a self-test in a random polarity half-cycle further allows processor 150 to enter a low power state sooner and thus consume less energy.

A self-test event initiated by processor 150 is generally preceded by processor 150 providing an override on signal 151 to prevent disconnection of load side conductors 115/120 from line side conductors 105/110, and may be succeeded by processor 150 releasing the override on signal 151. After releasing signal 152 to fault simulator 155 to end a simulated fault, processor 150 may delay a short time (e.g., 1 ms, 1-2 ms, 1-5 ms, 2-5 ms, 2 ms, 3, ms, 4 ms, 5 ms, etc.) prior to releasing the override on signal 151, to allow time for system settling. In a self-test event initiated by the manual push of reset button 125, processor 150 does not provide an override on signal 151.

In some embodiments, a self-test includes two or more self-test events. The two or more self-test events may be, but are not necessarily, separated by one or more half-cycles.

In one implementation, a self-test includes two self-test events performed on two different polarity half-cycles. This is beneficial, for example, to avoid incorrect detection of a fault or incorrect self-test failure, such as in the situation which there are low-current faults present but below a threshold (e.g., a standard requires there to be no fault detected for low-current faults measured at less than or equal to 4 mA). As an example: if the normal differential current caused by fault simulator 155 is 8 mA), and a 4 mA fault is already present (which alone should not be identified as a fault under certain standards), in a half cycle in which the 8 mA and 4 mA are subtractive, a differential current of less than the fault detection threshold may be measured such that the simulated fault is not detected; thus, the self-test would fail. In the opposite polarity half cycle, however, the applied 8 mA simulated fault and the existing 4 mA fault are additive, and a differential current greater than 8 mA (i.e., greater than the fault detection threshold) is measured such that the simulated fault is detected; thus, the self-test would pass. In general, if a self-test were performed only during a particular polarity half-cycle (whether it was a single half-cycle or multiple half-cycles of the same polarity) erroneous results could ensue and either the self-test would incorrectly fail or an actual powerline fault might not be detected. Therefore, performing self-test events in both (i.e., opposite) polarity half cycles allows for more accurate detection of faults and more accurate self-test results than performing one self-test event, or performing multiple self-test events in same-polarity half-cycles. Thus, in some embodiments, a self-test may include a first self-test event, and if a fault is detected in the first self-test event, a second self-test event may be performed in an opposite polarity half-cycle, such that a fault must also be detected in the opposite polarity half-cycle before a self-test failure is determined.

The two self-test events on different polarity half-cycles as described may be performed on adjacent half-cycles or non-adjacent half-cycles. For example, two self-test events may be on a first and second half-cycle, a first and a fourth half-cycle, a first and a sixth half-cycle, etc. More generally for any self-test including multiple self-test events, the self-test events may be performed in adjacent half-cycles or non-adjacent half-cycles (i.e., self-test events separated by one or more half-cycles).

In some cases, separation of the self-test events may be necessary to meet the requirements of a standard. For example, if a self-test including two or more self-test events is of a duration longer than the UL requirement for detecting a fault, the self-test events may be separated by one or more half cycles. Between self-test events, processor 150 stops asserting signal 151, thereby allowing electromechanical switching component 145 to react when actual failures detected by fault detection circuit 140 result in circuit 140 asserting signal 141 to disconnect load side conductors 115/120 from line side conductors 105/110. This spreading of the self-test over two or more self-test events may be beneficial for meeting certain UL specifications requiring a reduced detection time for actual faults with higher fault currents.

Additionally, in an implementation in which the simulated fault current (e.g., self-test current diversion) is always applied in synchronism with the phase conductor of line side conductors 105/110 (e.g., see the description of FIGS. 2 and 3), if a self-test were to be performed as one self-test event spanning two or more half-cycles, the amplitude of each half-cycle would be affected in the same way. A transformer used to measure differential current would filter out the direct current (DC) component, and thus the root-mean-square (RMS) amplitude of the differential current caused by the self-test event would be lower than if the simulated fault were applied only during one half-cycle. The simulated fault current would need to be increased to increase the differential RMS current; however, an increase in simulated fault current may not be allowed under the standard. It may be beneficial in some implementations, therefore, to use multiple self-test events, each occurring within only one half-cycle rather than a single self-test event spanning multiple half-cycles.

Zero crossings may be detected by monitoring amplitude on line side conductors 105/110. For example, in one embodiment, a rectified version of an AC waveform on line side conductors 105/110 is monitored to detect zero crossings of the rectified waveform. The zero crossings may be used to identify when to perform a line side conductor 105/110 self-test. For example, it may be desirable to perform a self-test within a half-cycle, and not while the phase is changing (e.g., at a zero crossing). In such a case, a self-test is initiated after a zero crossing is detected. A self-test may be initiated at any time within a half-cycle. If, however, it is desired that the self-test not extend over a zero crossing phase change, then a self-test is initiated within a half-cycle such that the self-test will end prior to the next zero crossing.

Zero crossings may be used to determine frequency and phase, which may be used to determine start times for self-test events. If the frequency of the power lines is known and stable, and the duration of the self-test is known, self-tests may be scheduled for a future time based on detection of zero crossings.

The ability to know the duration of a self-test is made possible by use of a comparator-type fault detection circuit. Previous GFCI designs used integrator-type fault detection circuits, and the amount of time required to detect a fault was dependent on the amplitude of the fault—the integration of a fault of large amplitude would exceed a threshold more quickly than the integration of a fault of relatively small amplitude. In a comparator-type fault detection circuit, the amplitude is not integrated, but compared directly (or after some filtering) to a threshold, making the determination of a fault generally quicker, and making the duration of a self-test event substantially predictable.

A UL standard may require that a self-test be performed within a certain time. For example, a requirement may be that, following the initial power-up, a self-test must be performed every three hours. More frequent self-tests may be performed, such as every minute, every fifteen minutes, every half hour, every hour, every two hours, randomly at least every 3 hours, at the occurrence of an event, etcetera. A timer may be programmed to indicate a next time for self-test. In one implementation, a timer is set to provide an indication periodically (e.g., every hour). In another implementation, a timer is set to provide one indication at some time in the future (e.g., five minutes), and the timer is reset at expiration. When a timer expires, processor 150 may receive an indication of the expiration. For example, if the timer is external to processor 150, the indication of expiration may be the timer asserting an input pin of processor 150, or sending a message to processor 150 via a communication link. In some embodiments, the indication may cause an interrupt to occur in the execution of instructions by processor 150. In some embodiments, processor 130 may be in a low power state (which may be one of several low power states available in processor 150) when the indication is received, and the indication causes processor 150 to ascend to a higher power state (which may be another of several low power states) to perform various functions, such as initiating a self-test. By operating in a low power state between self-tests, GFCI 100 saves energy.

In addition to self-testing events performed by applying simulated faults to line side conductors 105/110, processor 150 may also test one or more electronic or electromechanical components of GFCI 100. For example, components of fault detection circuit 140, fault simulator 155, circuit component 142, and power supply components may be tested, among others. Some examples are provided below with respect to the implementation illustrated by the circuit schematic in FIG. 2.

A self-test may be initiated manually by pushing test button 130 followed by pushing reset button 125, both provided on the GFCI housing. Pushing test button 130 forces a mechanical disconnection of the contacts of electromechanical switching component 145. The mechanical disconnection is latched, and released only when reset button 125 is pushed then released, and only if a self-test initiated by the pushing of reset button 125 passes. When reset button 125 is pushed, signal 126 is received by processor 150, which in turn initiates a self-test of GFCI 100 as described above, by asserting signal 152 to fault simulator 155, and monitoring signal 141 from fault detection circuit 140. The self-test may include multiple self-test events, as described above. In some embodiments, provision of an override on signal 151 may precede the manually-initiated self-test or a self-test event, and release of the override may succeed the self-test or a self-test event (with optional delay), as described above for non-manually-initiated self-tests. However, the override on signal 151 may be withheld during a manually-initiated self-test, so that a true fault (not simulated) keeps the contacts of electromechanical switching component 145 open, and so that a successful manually-initiated self-test allows the contacts of electromechanical switching component 145 to close when reset button 125 is released.

Thus, a manually initiated self-test is performed in the same manner, using the same fault simulator 155 and fault detection circuit 140, as a processor 150 initiated self-test. The manually initiated test may also include testing of various components in the GFCI, as discussed above. In some implementations, the manual test button 130 may be pressed at any time. In other implementations, the manual test button 130 may be pressed only while load side conductors 115/120 and line side conductors 105/110 are disconnected, or alternatively only while load side conductors 115/120 and line side conductors 105/110 are connected, with a mechanical mechanism preventing a manual button push at other times.

Reset button 125 may be equipped with a mechanical mechanism preventing a manual button push when load side conductors 115/120 and line side conductors 105/110 are connected. In such a case, a reset button 125 signal 126 is received by processor 150 only when load side conductors 115/120 and line side conductors 105/110 are disconnected.

GFCI 100 includes visual and/or audio indicator 135 to provide an alert when a fault is detected on line side conductors 105/110, or when a self-test failed. For example, visual/audio indicator 135 may include one or more lights (including light-emitting diodes (LEDs)), a speaker, a vibrator, a display, or other visual and/or audio indicator, or a combination of visual and/or audio indicators.

It may be beneficial to have an LED connected between the contacts of load side conductors 115 and 120 (e.g., between load phase and neutral contacts). When GFCI 100 is wired correctly, this LED indicates the presence of power at load contacts (terminals). But when GFCI 100 is mis-wired so that load side contacts are wired to line side conductors 105/110 and the line side contacts are wired to load side conductors 115/120, the LED may indicate the mis-wiring by failing to turn on, or by remaining on when GFCI 100 is in a tripped state.

It may also be beneficial to have an LED controlled by processor 150 to indicate a self-test failure and therefore possible conditions when it is may be dangerous to use GFCI 100.

In some embodiments, visual/audio indicator 135 provides a green LED load side power indicator and a red LED failure indicator. However, it may be confusing for the user to see both the green and red LEDs on at the same time. To avoid confusion, the green power LED may be turned off when the red failure LED is turned on, but this requires isolation between line and load side (GFCI 100 should provide dielectric isolation of about 2000 V between line and load when tripped), such as the addition of mechanical or optoelectronic isolation, increasing cost and reducing reliability of GFCI 100. To avoid these complications, a light pipe may be used to mix the green and red LED colors. Thus, when the red failure indicator LED is off, the user sees green, and when the red failure indicator LED is on, the more intense red light overpowers the green light and the user sees red. This approach does not require additional components for isolation.

Figure 4:
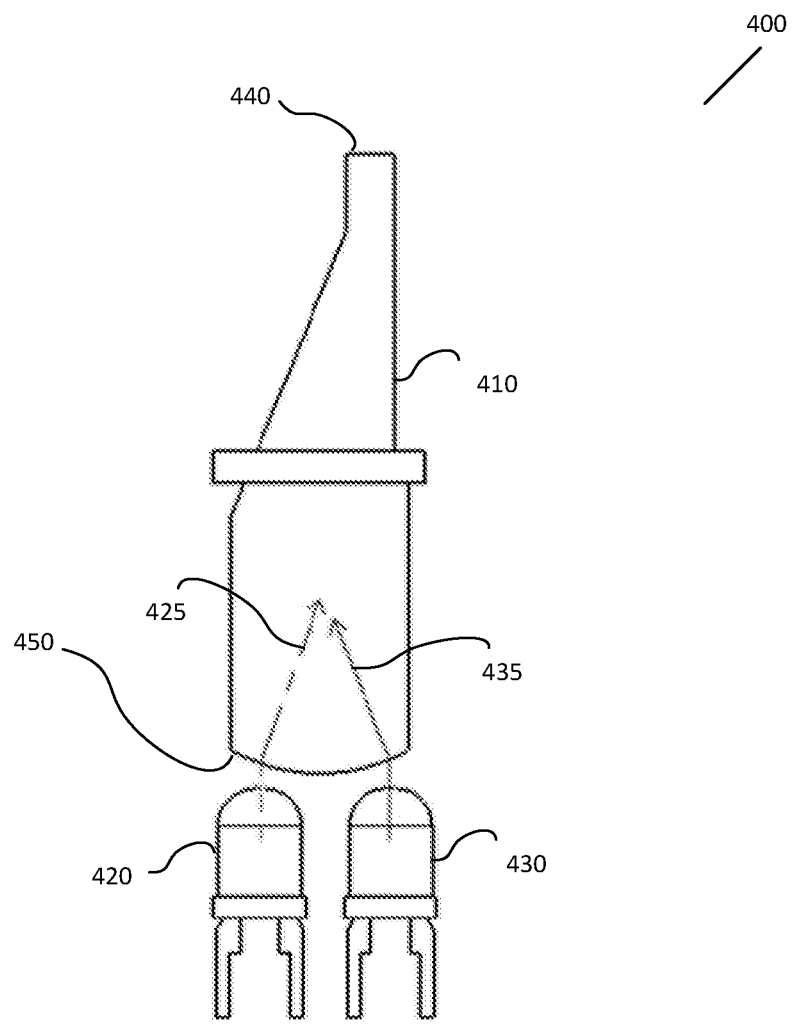
FIG. 4 illustrates an example of a light pipe.

FIG. 4 illustrates an example of an embodiment of a visual indicator 400 in which a light pipe 410 is used to direct light from LED 420 and LED 430 towards a user visible portion 440 of the light pipe 410. Light from LEDs 420 and 430 is directed by the geometry of the light pipe at an angle, as indicated by dotted line 425 and solid line 435, respectively. The light is directed according to the shape of a bottom surface 450 of light pipe 410 and/or the shape of the interior surface of light pipe 410. Bottom surface 450 may be a convex or concave lens, for example, and bottom surface 450 or other portion of light pipe 410 may include a faceted surface, diffractive element, prismatic element or other optical element. The directing of the light provides a mixing of the wavelengths of light from the two LEDs 420 and 430, avoiding "hot" spots of a single color at user visible portion 440 when both LEDs 420 and 430 are activated. The light pipe illustrated in FIG. 4 is provided by way of example, and not as a limitation. Many other light pipe shapes and LED/light pipe configurations and are also possible within the scope of this disclosure.

Figure 5A:
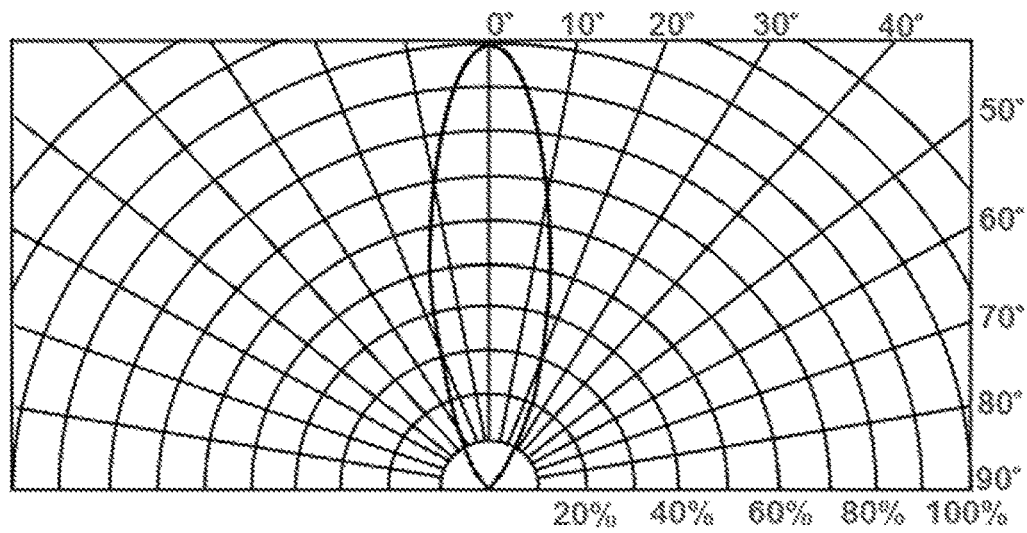
FIGS. 5A-5B are light directivity diagrams for two example LEDs.
Figure 5B:
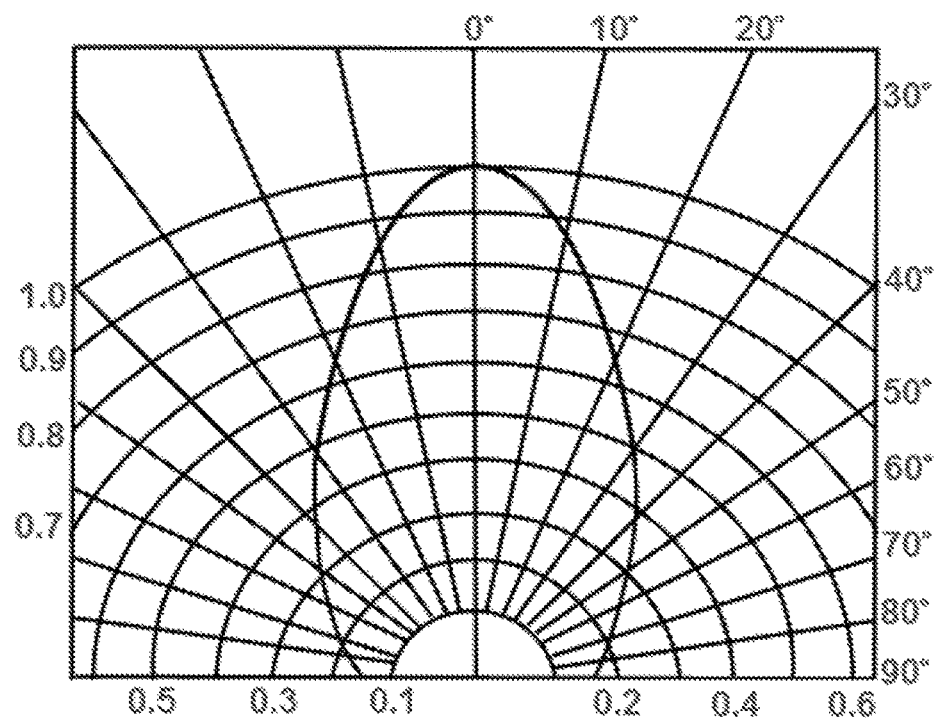

FIGS. 5A-5B illustrate relative intensity versus radiation angle, by way of example for a red LED and a green LED, respectively, showing that the maximum intensity of light is at the center of the LED. It may be preferable for less than the maximum intensity to be presented at user visible portion 440. The directing of the light as shown for the example of FIG. 4 shifts the light from the centers of LEDs 420 and 430 away from a direct path to user visible portion 440.

Figure 6:
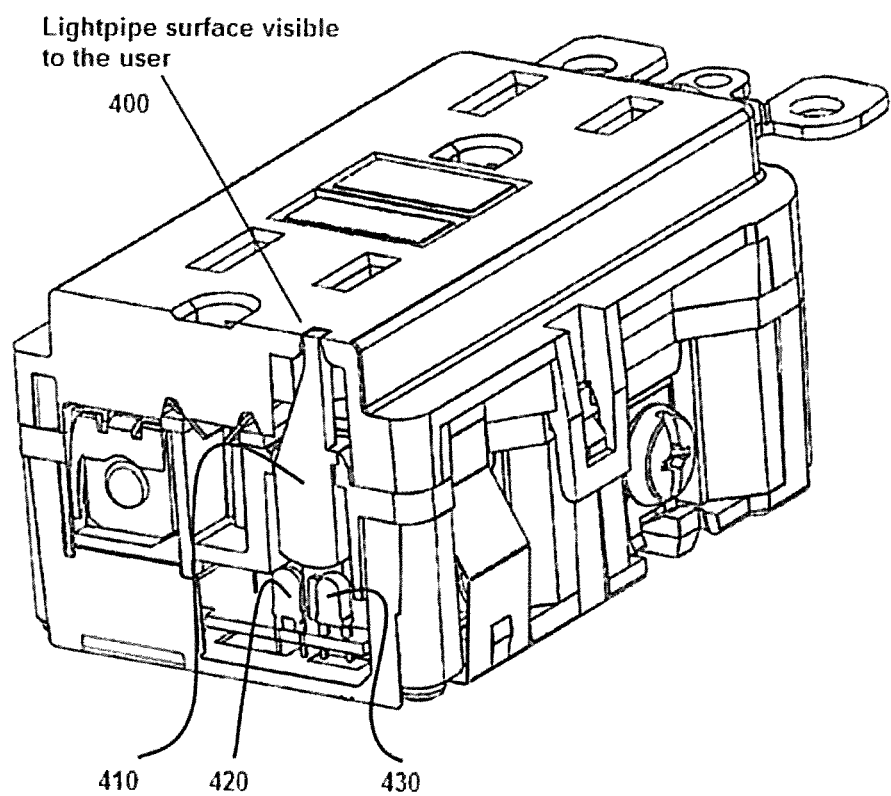
FIG. 6 illustrates one embodiment of a GFCI including a light pipe.

FIG. 6 illustrates an example of one embodiment of a GFCI according to the present disclosure, with light pipe 410 including user visible portion 440, and LEDs 420 and 430.

More generally, in one implementation, visual/audio indicator 135 includes a visual indicator in the form of a light pipe and one or more LEDs, and signal 136 represents control signals for the one or more LEDs from the following set: a first LED that is a first color (e.g., blue) and is used to indicate when power is present at line side conductors 105/110; a second LED that is a second color (e.g., yellow) and is used to indicate when power is present at load side conductors 115/120; and a third LED that is a third color (e.g., red) and used to indicate when a self-test failure or a component failure has occurred. If all three of the example LEDs are used, when GFCI 100 is operating properly, the first color and second color would be combined in the light pipe (e.g., blue/yellow); whereas, if a self-test or component failure occurs, the first color, second, and third color would be combined in the light pipe (e.g., blue/yellow/red); and after detecting a fault condition, the first color (e.g., blue) or the first and third colors (e.g., blue/red) would be present in the light pipe. In some implementations, LEDs may be selected, and the light pipe designed, such that one color is predominant over the other color(s) when the LEDs are on, and the predominant color is visible at the end of the light pipe. One or more of the LEDs could be turned on and off, such that the color appearing at the end of the light pipe would alternate between two colors (e.g., flashing the red LED such that the color alternates between blue/yellow and blue/yellow/red).

In one implementation, visual/audio indicator 135 includes a variable-colored LED, which may be controlled to indicate a present status of GFCI 100.

In one implementation, visual/audio indicator 135 includes a visual indicator in the form of multiple lights (e.g., LEDs or other small device that emits light), each light indicating the status of a different circuit, component, or self-test.

In one implementation, visual/audio indicator 135 includes a visual indicator in the form of an LCD screen or other electronic display, in which icons and/or text are used to indicate the status of various circuits, components, or self-tests.

In one implementation, visual/audio indicator 135 includes a visual indicator that provides a distinctive visual display for line side conductor 105/110 self-test failures versus detected faults detected by fault detection circuit 140. For example, a colored LEI) (e.g., red) may be driven to emit visually continuous light to represent a detected fault, and the LED may be flashed to represent a line side conductor 105/110 self-test failure. Other schemes using one or more visual indicators may alternatively be used, including, for example, a visual display that distinguishes component self-test failures from faults and line side conductor 105/110 self-test failures.

In one implementation, self-test failure indication includes transient failure forgiveness: more than one self-test failure must occur before indication of a self-test failure by visual/audio indicator 135, and a predetermined time without self-test failures may cause a self-test failure indication to be removed. For example, a counter may be increased at each self-test failure and decreased once each second, and an indication made if the counter crosses a first threshold as it increases, and the indication removed if the counter crosses that threshold or another threshold as the count decreases.

In one implementation, if a first self-test fails, a next self-test can be performed for a shorter duration than normal to verify the failure detection and avoid false tripping caused, for example, by temporary conditions on the power line.

In addition to providing status information visually and/or audibly by way of controlling visual/audio indicator 135, processor 150 may provide status information (e.g., fault, failure, proper operation, tripped, etc.) via a wired or wireless communication link (including power line communication) to an external device either on the premises or remote from the premises.

Having described generally the operation of GFCI 100 in accordance with this disclosure, one specific example is next described.

Figure 2:
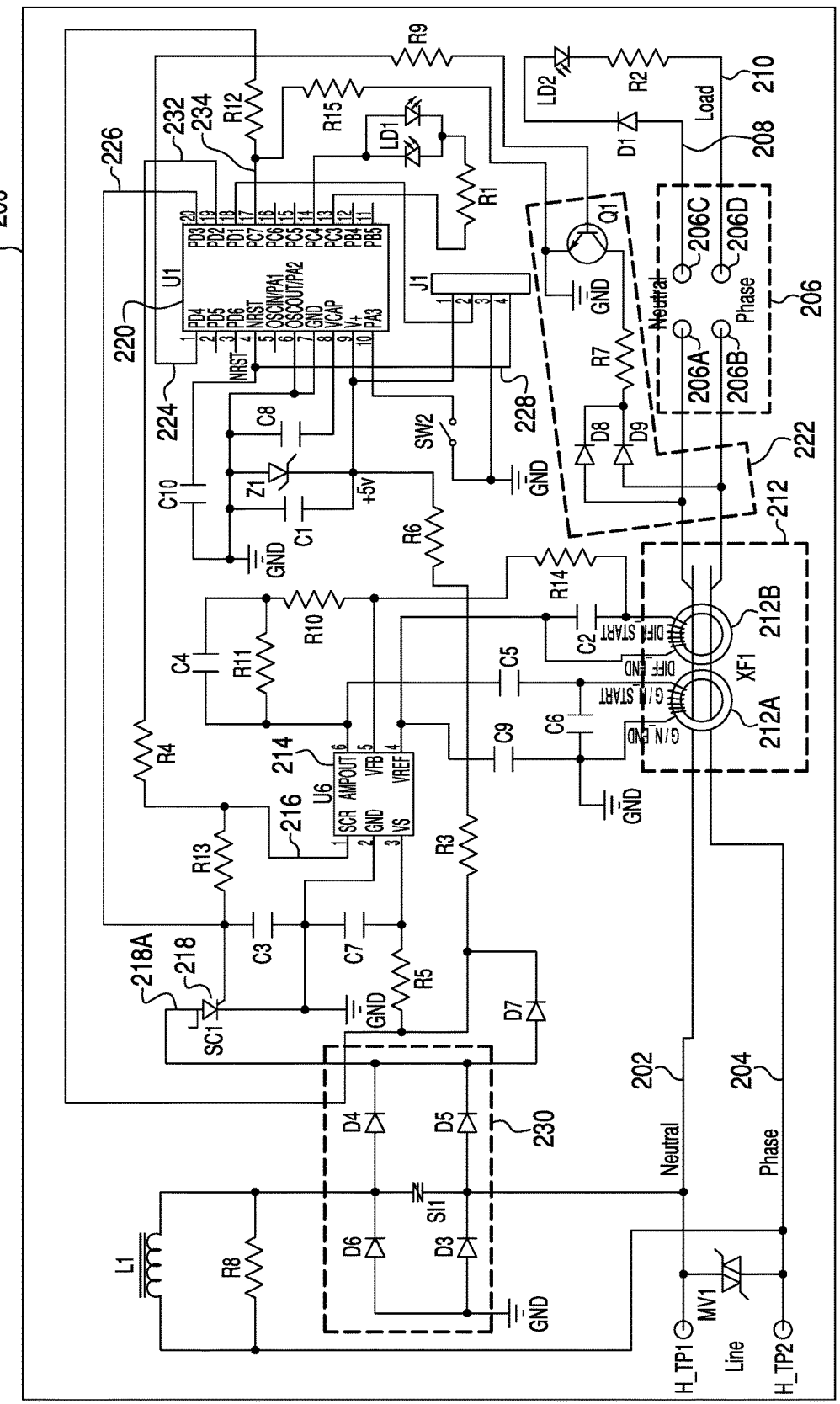
FIG. 2 is a schematic illustration of one embodiment of a GFCI according to this disclosure.

FIG. 2 is a circuit diagram representing one embodiment of a GFCI in accordance with this disclosure. The circuit diagram describes electrical connections between components in a GFCI 200 but is not intended to be illustrative of physical size, dimension, or placement of the components. GFCI 200 is generally positioned within a housing (not shown) to isolate the electrical circuits from human contact. GFCI 200 may be incorporated within another electronic device, and as such may share a housing with the other electronic device. GFCI 200 may include additional components and functionality than is illustrated and described with respect to FIG. 2.

In GFCI 200, line side conductors 202 and 204 represent line side neutral and a phase conductor, respectively, that traverse GFCI 200 from a physical entry point on the housing of GFCI 200 to one side of a relay 206. In particular, line side neutral conductor 202 connects to relay 206 at electrical contact 206A, and line side phase conductor 204 connects to relay 206 at electrical contact 206B. Power is sourced through line side conductors 202/204.

Load side conductors 208 and 210 extend from relay 206 to a physical exit point or points on the housing of GFCI 200 (e.g., terminating at outlet plugs and/or extending through holes in the housing). In particular, load side conductor 208 connects to relay 206 at electrical contact 206C, and load side conductor 210 connects to relay 206 at electrical contact 206D.

Relay 206 may include additional contacts beyond those illustrated to connect multiple load side conduits 208/210, and may in some implementations be multiple relays 206.

When the contacts of relay 206 are closed, there is an electrical connection between points 206A and 206C such that line side neutral conductor 202 is electrically connected to load side conductor 208, and an electrical connection between points 206B and 206D such that line side phase conductor 204 is electrically connected to load side conductor 210. In this manner, control of relay 206 allows for selective connection/disconnection of line side conductors 202/204 from load side conductors 208/210.

Relay 206 is controlled by way of a solenoid. When sufficient current flows through the solenoid coil, an electromechanical mechanism forces the contacts of relay 206 apart, thereby opening the electrical connection between points 206A and 206C and the electrical connection between points 206B and 206D. In the embodiment illustrated in FIG. 2, the solenoid coil is shown as coil L1. Under normal operating conditions (i.e., no fault), the current flowing through L1 is not sufficient to cause the electromechanical mechanism to force the contacts of relay 206 open. When a fault condition is detected, sufficient current is caused to flow through L1 to open the contacts of relay 206, as described below.

A current detection device 212 detects current flowing through one or both of conductors 202/204. Examples of detecting current using different coil configurations are provided in co-pending U.S. patent application Ser. No. 14/089,700 filed Nov. 25, 2013, published as US2014/0218044. In the embodiment of FIG. 2, current detection device 212 includes two coils 212A and 212B. Coil 212A is used to detect grounded neutral conditions. Coil 212B is used to detect current differential between line side conductors 202/204, and the induced current is measured by an integrated circuit 214.

IC 214 monitors the current induced in coil 212B. IC 214 is a comparator-type ground fault interrupter IC, such as, by way of example, a Fairchild Semiconductor FAN4147 ground fault interrupter or RV4141 low power ground fault interrupter. If IC 214 detects a fault condition, IC 214 asserts an output 216. In the embodiment of FIG. 2, IC 214 asserts output 216 by providing a logic high level at pin 1. The assertion of output 216 activates silicon-controlled rectifier (SCR) 218 via resistor R13, which in turn causes SCR 218 to latch and conduct current. When SCR 218 is conducting current, the voltage at anode 218A decreases, causing sufficient current to flow through solenoid coil L1 to open the electrical contacts of relay 206.

A processor 220 monitors output 216 of IC 214 to identify when a fault has been detected by IC 214. Processor 220 is illustrated as a STMicroelectronics STM8S003F3. Other processors may alternatively be used, including microcontrollers, field programmable gate arrays (FPGAs), application-specific integrated circuits (ASICs), or the like. Processor 220 uses a low frequency clock source (internal or external) to minimize power consumption. Processor 220 is powered in at least three states: off, low power, and normal operation power. Multiple low power states may be implemented, and processor 220 may perform some operations in one low power state and other operations in another low power state. Power control may be achieved through circuitry external to processor 220 such as by way of a regulator IC, or may be achieved by self-control of processor 220.

A timer may be used to transition processor 220 from a low power state to a higher power state. For example, a timer may be set to periodically wake processor 220 from a low power sleep state to perform various operations such as self-testing GFCI 200. The timer may assert an interrupt to processor 220 to wake up processor 220. Multiple timers may be used. A timer may be external to processor 220, and assert the interrupt by way of an input to processor 220. A timer may be internal to processor 220. In addition to a timer, processor 220 may have an input connected to a manual pushbutton, which may trigger an action by processor 220. The action may include waking processor 220 from a low power state.

Processor 220 controls a fault simulation circuit 222 by way of a control signal 224. In the embodiment of FIG. 2, fault simulation circuit 222 includes transistor Q1, resistor R7, and diodes D8 and D9. When processor 220 asserts a logic high on control signal 224, transistor Q1 is turned on and the cathodes of diodes D8 and D9 are connected to a GFCI ground (e.g., neutral line side conductor 202 potential). Depending on the present polarity of the current through line side conductors 202/204, one of diodes D8 and D9 will conduct, and a small amount of current will be diverted from the respective line side conductor 202 or 204, causing a difference between the current in line side conductors 202/204. Processor 220 monitors output 216 at input 232 to determine whether IC 214 accurately detects the simulated fault.

A self-test may be initiated by processor 220 at the expiration of a timer, at the receipt of an input indicating push of a manual button, at the receipt of a request via a communication interface, or at other times in accordance with the instructions programmed into instruction memory used by processor 220.

Prior to initiating a self-test, processor 220 generally disables SCR 218 by providing a low voltage at output 226 that inhibits an assertion of output 216 from causing SCR 218 to activate. In this manner, a self-test of GFCI 200 does not cause the contacts of relay 206 to open, which would cause a disconnection of load side conductors 208/210 from line side conductors 202/204. If a self-test fails, processor 220 may cause SCR 218 to activate and latch by providing a high voltage at one or both of outputs 226 and 232.

Processor 220 may monitor the voltage or polarity of line side conductors 202/204, such as via resistor R12, and initiate a self-test after detecting a zero crossing in either direction. One advantage of this technique is that the self-test may be performed during either the positive or negative half-cycle instead of waiting for a particular polarity half-cycle. Another advantage of this technique is that the self-test may be initiated as soon as a first zero crossing is detected. These advantages allow for performing a self-test quickly at initial power-up and thereafter. Additionally, the technique is advantageous in detecting a failure of a diode D3-D6, as discussed below.

Processor 220 may perform a self-test by initiating self-test events in one or more half cycles. If a first self-test event is not successful, meaning that IC 214 did not assert output 216 after application of the simulated fault, processor 220 may log the self-test failure, and/or attempt another self-test in the same polarity or opposite polarity half-cycle (or both polarity half-cycles) to verify the fault. Processor 220 may determine to indicate a self-test failure after a single failure, or indicate a self-test failure only after two or more self-test failures.

Processor 220 may save information regarding the self-tests, and/or provide information regarding the self-tests to another device by way of a communication interface. Information regarding the self-tests may include one or more of: a pass/fail indication, date, time, duration, number of self-tests, polarity of first half-cycle tested, number of half or full cycles between self-tests, time between initiation of a simulated fault and detection of the simulated fault, and other information useful in the monitoring of power lines.

When a self-test is completed, processor 220 de-asserts control signal 224 to remove the simulated fault. In the embodiment of FIG. 2, processor 220 provides a logic low on control signal 224 which switches off transistor Q1. Processor 220 then removes the low voltage at output 226 (e.g., by setting the output to a high-impedance state), thereby again allowing IC 214 to activate SCR 218 through assertion of output 216 upon detection of a fault. To allow for system settling following removal of the simulated fault, processor 220 may wait a time after de-asserting control signal 224 before removing the low voltage at output 226. Such a wait time may also be used between successive self-test events to avoid residue from one self-test event from affecting a subsequent self-test event.

A mechanical disconnect button (not shown) in GFCI 200 provides for disconnection of load side conductors 208/210 from line side conductors 202/204 via a mechanical device (not shown) that latches the contacts of relay 206 open. A reset button in GFCI 200, shown as switch SW2 in FIG. 2, provides a signal to processor 220 when pushed. Processor 220 responds to the signal by initiating a self-test event in the manner described above, except that processor 220 does not inhibit the activation of SCR 218 with a low voltage on output 226. If the self-test event passes, IC 214 detects the simulated fault and asserts output 216, causing the mechanical device to release the contacts of relay 206 such that the line side conductors 202/204 may be connected to load side conductors 208/210 when SW2 is released. If the self-test event fails, IC 214 would not assert output 216, and thereby the contacts of relay 206 would be held open. Thus, reset lockout is provided. Additionally, processor 220 may indicate that the self-test following the push of the reset button passed or failed, such as by causing a visual or auditory indication, or by sending a message through a communication interface.

In addition to the self-test described using simulated fault conditions, GFCI 200 includes several mechanisms to detect component failures or other circuit failures.

Processor 220 and IC 214 are powered by line side conductors 202/204 through coil L1 and rectifier 230 (illustrated in FIG. 2 by diodes D3-D6). One advantage of this configuration is improved performance during surge. A resistor R8 in parallel with coil L1 provides for indicating a failure of coil L1. If coil L1 is broken such that current does not flow through coil L1, processor 220 and IC 214 are powered through resistor R8. Resistor R8 is a high-value resistor, selected to allow insufficient current to processor 220 and IC 214 for normal operation. For example, the value of resistor R8 may be selected to prevent operation of IC 214 and processor 220, or prevent operation of IC 214 and allow at least partial operation of processor 220, or allow partial operation of IC 214 and at least partial operation of processor 220. In any case, the value of resistor R8 is selected such that, if power is being provided to IC 214 and processor 220 solely through resistor R8, a self-test initiated by processor 220 will fail. Resistor R8 may be selected to provide sufficient power to processor 220 to log or transmit an indication of self-test failure, or to provide an audio or visual indication.

As a verification of rectifier 230, processor 220 may count the number of zero crossings in a time interval, and compare the number of zero crossings counted to a number of zero crossings expected. For example, in the embodiment of FIG. 2, if one of the diodes D3-D6 of rectifier 230 is electrically disconnected, the normal full wave rectification will become half-wave rectification, and the number of zero crossings detected at processor 220 input 234 in a given time interval will drop by half. If a rectifier 230 failure is detected in this manner, processor 220 may determine to not perform subsequent self-testing. In one implementation, a check of rectifier 230 precedes each self-test, and a failure of the rectifier 230 check causes the self-test to not be performed.

If there is a failure of the zero-crossing detector circuit itself, the check of rectifier 230 will fail. For example, if resistor R12 is open, no zero crossings will be detected.

Processor 220 monitors resistor R13, as resistor R13 is necessary to trigger a disconnection of load side conductors 208/210 from line side conductors 202/204 in the event of a detected fault condition. In the embodiment of FIG. 2, IC 214 includes a current source on output 216, which causes a voltage drop across resistor R13 which may be monitored by processor 220. For example, during a self-test when a simulated fault is detected and IC 214 asserts output 216 while processor 220 provides a low voltage at output 226 to inhibit SCR 218 from activating, the voltage drop across resistor R13 is defined by the current from output 216 and the resistance of resistor R13 (e.g., approximately 0.5 V), which may be detected by processor 220 by the voltage at input 232. If resistor R13 is disconnected or its value changes, the change in resistance may be detected as a change in voltage at input 232—if resistor R13 is open (i.e., disconnected or broken), no current will flow through resistor R13, and the voltage at input 232 will be the voltage provided by IC 214 output 216 (e.g., 5 V).

Protection from power line surges is provided by components such as a metal oxide varistor (MOV) and a transient voltage suppressor (TVS), as described in co-pending application U.S. Pat. Pub. No. 2013/0027819.

Figure 3:
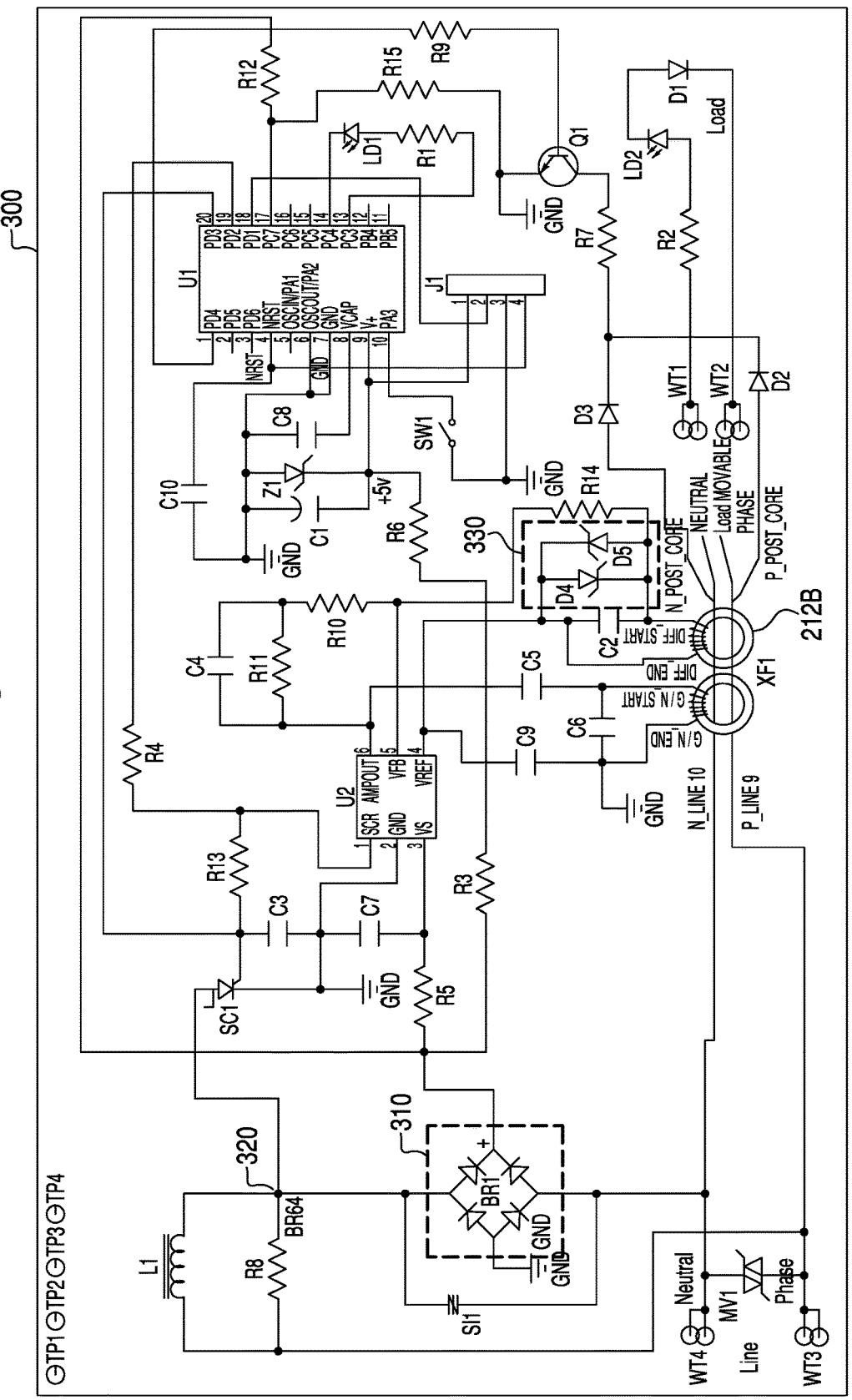
FIG. 3 is a schematic illustration of another embodiment of a GFCI according to this disclosure.

FIG. 3 is a circuit diagram representing another embodiment of a GFCI in accordance with this disclosure. The circuit diagram describes electrical connections between components in a GFCI 300 but is not intended to be illustrative of physical size, dimension, or placement of the components. GFCI 300 is similar to GFCI 200 illustrated in FIG. 2; therefore, only relevant differences are discussed.

In GFCI 300, the circuit components of rectifier 230 in FIG. 2 are replaced by an integrated rectifier 310; the anode 218A of SCR 218 is connected to the AC input of rectifier 310 at point 320 rather than to the DC output of rectifier 230 as in FIG. 2; and diode clamp 330 is added across coil 212B.

The connection of anode 218A of SCR 218 to the AC input of rectifier 310 means that SCR 218 may only be unlatched during a positive half-cycle. Thus, a self-test initiated by pushing a manual reset button (after SCR 218 latches, causing relay 206 contacts to open and be mechanically latched) must be performed in a positive half-cycle. If cycle polarity is known, a self-test may be performed in the positive half-cycle. If cycle polarity is unknown, a self-test includes at least two self-test events in opposite polarity haft-cycles so that, if the self-test passes, SCR 218 may be unlatched.

Diode clamp 330 allows for detection of more fault conditions, such as improved detection of high current faults. Without diode clamp 330, a high current differential fault current causes the transformer core (of coils 212A and 212B) to saturate, such that a narrow pulse is induced in coil 212B which may appear as noise to the comparator-type IC and not a fault condition. Diode clamp 330 shorts the coil 212B core to prevent saturation, providing a longer duration pulse that may be detected as a fault condition.

In many applications, it is important to maintain connection between load side conductors and line side conductors unless it is considered too dangerous to do so. In these applications, a failure of a self-test or a component failure by itself will not cause a disconnection of load side conductors from line side conductors. Instead, such self-test or component failures may be logged and/or transmitted via a communication interface, as described above. Additionally or alternatively, the GFCI may provide a local indication of self-test failure or component failure. A local indication may be an audible sound such as a solid or pulsating tone, a shriek, a buzzer, enunciation of words, or any other sound or combination of sounds. A local indication may be visual, such as a solid or flashing light, an icon display, or a text display. Different local indications may be used to indicate different conditions. For example, a flashing light may indicate a component failure whereas a solid light may indicate a simulated fault self-test failure.

In the embodiment of FIG. 2, the pair of LEDs labeled LD1 is controlled by processor 220 to indicate a self-test failure (including a tested component failure). Also shown in FIG. 2 is an LED labeled LD2 which is powered whenever load side conductors 208/210 are connected to line side conductors 202/204 through relay 206.

According to UL 943, the GFCI must detect faults occurring in either AC half-cycle, and the GFCI should trip when there is a fault of 6 mA or more in either direction, and should not trip when the fault is less than 4 mA. These requirements apply over an ambient temperature range of −35 C./+66 C. with a maximum load of 20A.

An SCR (e.g., SCR 218 in FIG. 2) was described above as an example of a switching mechanism to activate the solenoid that controls the disconnection of the relay contacts. An SCR may be used due to its higher robustness, lower cost and smaller size as compared with other switching mechanisms such as MOSFET or IJBT transistors.

The GFCI chip (e.g., IC 214 in FIG. 2) may detect a fault and generate an SCR firing pulse at either polarity of the AC line. A fault detected at either polarity should turn on the SCR. However, an SCR can be turned on and latched only at one polarity of an AC voltage applied to the anode of the SCR.

One option is to locate the SCR inside the diode bridge of the rectifier, as shown in FIG. 2, so that it may be turned on at either line polarity. To shut the SCR off again, current through the SCR must fall below the holding current threshold. However, when the SCR is inside the bridge, the current through the SCR may not fall below the threshold due to the phase shift between current and voltage, and some "backup" current from GFCI circuitry taking energy from the same bridge. This may be especially true at high ambient temperatures.

Another option is to locate the SCR outside the bridge of the rectifier, as shown in FIG. 3, with AC voltage at the anode. In this configuration, commutation of the SCR may be more reliable. In some such designs using a half wave rectifier, it is also possible to test SCR integrity in self-test devices during the half cycle when the SCR cannot latch. If, however, there is an offset in the GFCI chip amplifier at the fault level between 4 and 6 mA, the GFCI chip may detect a fault and generate a trigger pulse at a first half-cycle but not at a second half-cycle of opposite polarity. Offset is difficult to avoid, due to the tolerances in magnetic properties of the current sensors over the temperature range, for example. Thus, if the first half-cycle happens to be the one in which the SCR cannot latch, the GFCI will not trip even though a fault was detected. Moreover, there is a resulting undesirable asymmetry in the actual fault detection levels.

To ensure that the SCR is turned on for a failure detected in either polarity, the GFCI IC output (e.g., output 216 in FIG. 2) may be monitored by the processor (e.g., processor 220). When the processor sees an assertion of the IC output to the SCR, the processor can ensure that the SCR latches. The processor may monitor one or more voltages or currents in the GFCI circuitry to identify whether the SCR was latched, and if not, cause the SCR to latch at the next half-cycle. Alternatively, the processor may monitor the half-cycle polarity, and if the IC asserts the output to the SCR during a half-cycle in which the SCR cannot respond, the processor causes the SCR to latch at the next half-cycle. If the processor doesn't have information about the polarity of the AC voltage, the processor can attempt to cause the SCR to latch during two consecutive half-cycles (or two half-cycles separated by an even number of half-cycles).

In one embodiment, the same processor pin which is used to block the SCR from triggering during self-test may be used to trigger the SCR. Alternatively, a separate processor pin may be used.

An embodiment of the disclosure relates to a non-transitory computer-readable storage medium having computer code thereon for performing various computer-implemented operations. The term "computer-readable storage medium" is used herein to include any medium that is capable of storing or encoding a sequence of instructions or computer codes for performing the operations, methodologies, and techniques described herein. The media and computer code may be those specially designed and constricted for the purposes of the embodiments of the disclosure, or they may be of the kind well known and available to those having skill in the computer software arts. Examples of computer-readable storage media include, but are not limited to: magnetic media such as hard disks, floppy disks, and magnetic tape; optical media such as CD-ROMs and holographic devices; magneto-optical media such as optical disks; and hardware devices that are specially configured to store and execute program code, such as ASICs, programmable logic devices (PLDs), and ROM and RAM devices. In the embodiments of FIGS. 2 and 3, processor 220 may execute code stored in internal memory, or code stored in a storage medium (e.g., flash memory) within GFCI 200/300.

Examples of computer code include machine code, such as produced by a compiler, and files containing higher-level code that are executed by a computer using an interpreter or a compiler. For example, an embodiment of the disclosure may be implemented using Java, C++, or other object-oriented programming language and development tools. Additional examples of computer code include encrypted code and compressed code. Moreover, an embodiment of the disclosure may be downloaded as a computer program product, which may be transferred from a remote computer (e.g., a server computer) to a requesting computer (e.g., a client computer or a different server computer) via a transmission channel. Another embodiment of the disclosure may be implemented in hardwired circuitry in place of, or in combination with, machine-executable software instructions.

Thus is described a GFCI which detects faults of line side conductors, and disconnects load side conductors from line side conductors upon detection of a fault. Also described is the self-test capability of the GFCI, in which the GFCI tests its fault detection function by simulating a line side conductor fault and determining whether the fault is properly detected, and tests various components of the GFCI for proper operation. The GFCI includes various mechanisms for entering a known state upon the occurrence of certain component failures. The GFCI further includes a reset lockout to prevent return from a reset, such as to prevent power supply to the load under certain conditions (e.g., the GFCI cannot respond to a ground fault).

The GFCI has been described for the monitoring of two conductors. However, the GFCI may alternatively monitor one, three, or more than three conductors, and the self-test may simulate a fault on any one or more conductor.

While the disclosure has been described with reference to the specific embodiments thereof, it should be understood by those skilled in the art that various changes may be made and equivalents may be substituted without departing from the true spirit and scope of the disclosure as defined by the appended claims. In addition, many modifications may be made to adapt a particular situation, material, composition of matter, method, operation or operations, to the objective, spirit and scope of the disclosure. All such modifications are intended to be within the scope of the claims appended hereto. In particular, while certain methods may have been described with reference to particular operations performed in a particular order, it will be understood that these operations may be combined, sub-divided, or re-ordered to form an equivalent method without departing from the teachings of the disclosure. Accordingly, unless specifically indicated herein, the order and grouping of the operations is not a limitation of the disclosure.

What is claimed is:

1. An apparatus, comprising:
    an interruption circuit electrically connected in a power delivery path, the power delivery path including a phase conductive path and a neutral conductive path;
    a fault detection circuit coupled to the interruption circuit and configured to provide a fault signal to selectively cause the interruption circuit to interrupt power delivery in at least one of the phase conductive path and the neutral conductive path;
    a fault simulation circuit; and
    a processor coupled to the fault simulation circuit and the fault detection circuit, the processor configured to selectively control the fault simulation circuit to simulate a fault in the power delivery path and detect a response of the fault detection circuit to the simulated fault; and
    a power circuit including a solenoid coil, a rectifier, and a first resistor in parallel with the solenoid coil, wherein the processor and the fault detection circuit are powered from a line side of the power delivery path via the solenoid coil and rectifier, and the resistor is sized such that, if the solenoid coil is damaged, the resistor will not allow sufficient power for proper operation of both the processor and the fault detection circuit.

2. The apparatus of claim 1, further comprising:
    a trigger circuit; and
    a second resistor positioned between the fault detection circuit and the trigger circuit;

wherein the processor is further configured to monitor a voltage across the second resistor during a simulated fault, and determine from an amplitude of the voltage whether the value of a resistance of the second resistor is within acceptable limits.

3. The apparatus of claim 1, comprising:
a connection device configured to electrically connect conductors receiving line side power to conductors providing load side power, wherein:
the fault detection circuit is configured to detect faults related to the load side conductors, and the fault detection circuit includes:
    a sensing coil configured to sense a differential current between two line side conductors; and
    a fault detection integrated circuit (IC);
the processor is configured to initiate and control a simulation of a load side conductor fault and determine whether the fault detection circuit detects the resulting simulated fault; and
the apparatus further comprises a visual indicator, wherein the visual indicator is a first color when power is present on the load side conductors, and changes to a second color to indicate improper operation of the apparatus or a fault related to the load side conductors.

4. The apparatus of claim 3, wherein the visual indicator is the output of a light pipe comprising:
    a first light emitting diode (LED) powered by the load side conductors and emitting the first color; and
    a second LED powered by the line side conductors and controlled by the processor, the second LED emitting a third color;
    wherein the light pipe is configured to provide a combination of light from the first LED and the second LED as the visual indicator, and the second color is provided by a combination of the first color and the third color.

5. The apparatus of claim 3, wherein the processor is further configured to selectively control an introduction of a current imbalance between two line side conductors during a fault simulation, the processor is configured to control the introduction of an initial current imbalance during a portion of a first power half-cycle and subsequently control the introduction of a next current imbalance during a portion of a second power half-cycle, and wherein the first power half-cycle and the second power half-cycle are separated in time by at least one power half-cycle.

6. The apparatus of claim 5, wherein the first power half-cycle is randomly either a positive polarity or a negative polarity.

\* \* \* \* \*